(12) United States Patent
Lee et al.

(10) Patent No.: US 8,159,813 B2
(45) Date of Patent: Apr. 17, 2012

(54) MULTILAYER CHIP CAPACITOR, MOTHERBOARD APPARATUS HAVING THE SAME, AND POWER DISTRIBUTION NETWORK

(75) Inventors: Byoung Hwa Lee, Gyunggi-do (KR); Sung Kwon Wi, Seoul (KR); Hae Suk Chung, Seoul (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 390 days.

(21) Appl. No.: 12/270,330

(22) Filed: Nov. 13, 2008

(65) Prior Publication Data

US 2009/0244807 A1 Oct. 1, 2009

(30) Foreign Application Priority Data

Apr. 1, 2008 (KR) .................. 10-2008-0030383
Jun. 16, 2008 (KR) .................. 10-2008-0056543

(51) Int. Cl.
*H01G 4/005* (2006.01)
*H01G 4/06* (2006.01)
(52) U.S. Cl. .................. 361/329; 361/303; 361/311
(58) Field of Classification Search .................. 361/303, 361/311, 328–329
See application file for complete search history.

(56) References Cited

U.S. PATENT DOCUMENTS

| | | | |
|---|---|---|---|
| 6,407,904 B1 * | 6/2002 | Kuroda et al. ............. | 361/303 |
| 2006/0209492 A1 | 9/2006 | Togashi | |
| 2007/0121275 A1 * | 5/2007 | Takashima et al. ........ | 361/311 |
| 2008/0204969 A1 | 8/2008 | Takashima et al. | |

FOREIGN PATENT DOCUMENTS

| | | | |
|---|---|---|---|
| JP | 08097070 A | * | 4/1996 |
| JP | 2007-142295 | | 6/2007 |
| KR | 10-2007-0002654 | | 1/2007 |

* cited by examiner

*Primary Examiner* — Eric Thomas
(74) *Attorney, Agent, or Firm* — McDermott Will & Emery LLP

(57) ABSTRACT

There is provided a multilayer chip capacitor including: a capacitor body including first and second capacitor units arranged in a laminated direction; and first to fourth outer electrodes formed on side surfaces of the capacitor body, respectively, wherein the first capacitor unit includes first and second inner electrodes of different polarities alternately arranged in the capacitor body to oppose each other while interposing a corresponding one of dielectric layers, the second capacitor unit includes third and fourth inner electrodes of different polarities alternately arranged in the capacitor body to oppose each other while interposing another corresponding one of the dielectric layers, the first and second capacitor units are electrically insulated from each other, and the first capacitor unit operates in a first frequency range and the second capacitor unit operates in a second frequency range lower than the first frequency range.

33 Claims, 24 Drawing Sheets

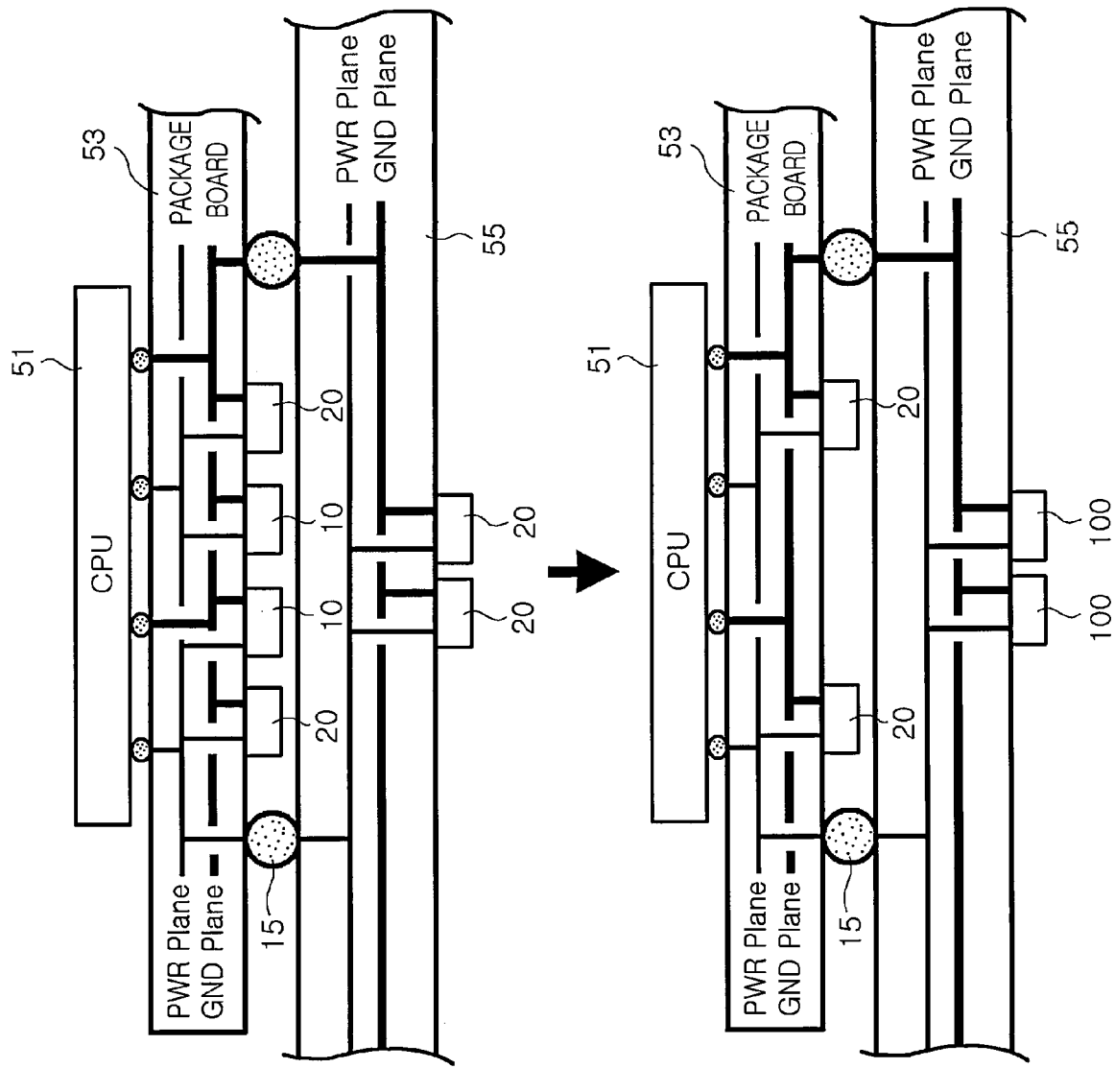

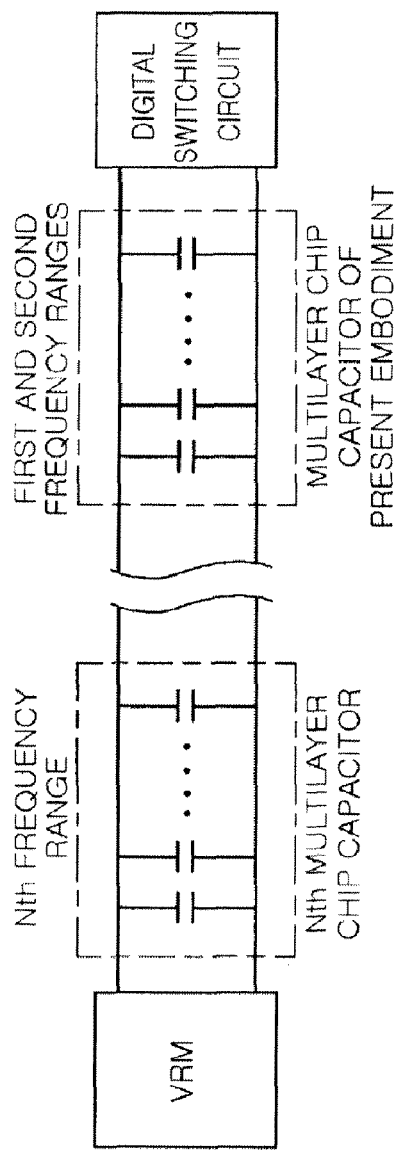
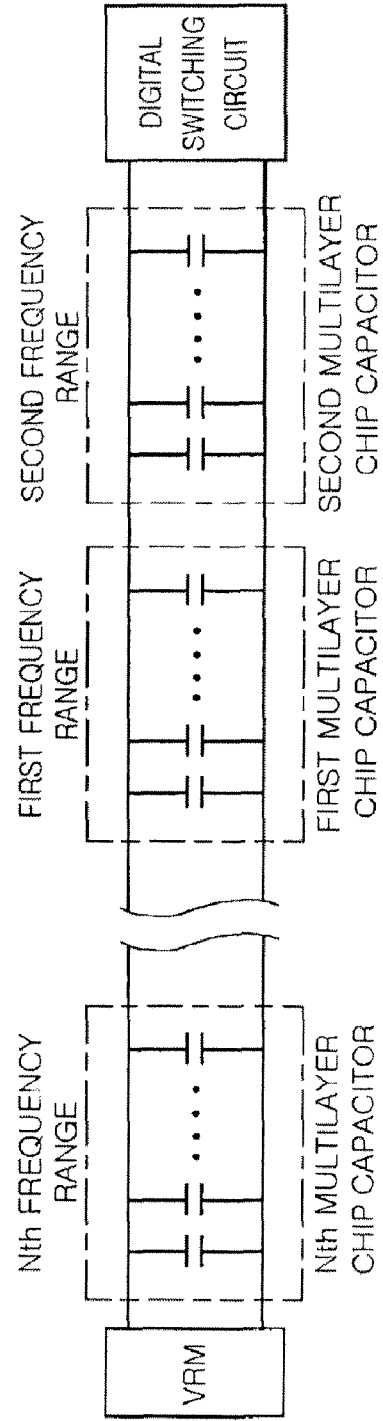
FIG. 23A
FIG. 23B PRIOR ART

MULTILAYER CHIP CAPACITOR, MOTHERBOARD APPARATUS HAVING THE SAME, AND POWER DISTRIBUTION NETWORK

CROSS-REFERENCE TO RELATED APPLICATIONS

This application claims the priorities of Korean Patent Application Nos. 2008-0030383 filed on Apr. 1, 2008 and 2008-0056543 filed on Jun. 16, 2008, in the Korean Intellectual Property Office, the disclosures of which are incorporated herein by reference.

BACKGROUND OF THE INVENTION

1. Field of the Invention

The present invention relates to a multilayer chip capacitor, and more particularly, to a multilayer chip capacitor suitably used as a decoupling capacitor of a power distribution network of a digital switching circuit such as a micro processor unit (MPU) and capable of maintaining a power network distribution network impedance at a low level in a broad frequency range as a single capacitor, a motherboard apparatus having the same and a power distribution network.

2. Description of the Related Art

A power distribution network (PDN) of a micro processor unit (MPU) is designed with increasing difficulty due to higher speed and more integration of the MPU. Notably, a decrease in a power voltage and an increase in an MPU consumption current resulting from more integration of the MPU has been gradually lowering a target impedance $Z_{target}$, as represented by following Equation 1:

$$Z_{target} = Vp \times AR/I = Vr/I \quad \text{Equation 1}$$

where Vp is a power voltage, AR is an allowed ripple, I is an MPU consumption current, an Vr is an allowed ripple voltage.

A general ripple voltage Vr is a value equal to 5~10% of the power voltage. The target impedance $Z_{target}$ should be satisfied not only in a direct current (DC) but also in all frequencies where a transient current is present. A personal computer (PC) or a laptop computer undergoes a transient current even in a very high frequency range due to higher speed of a central processing unit (CPU), i.e., MPU chip and thus should satisfy a target impedance even in a broad frequency range. To satisfy the target impedance in each frequency range, the PDN employs a voltage regulator module (VRM), a bulk capacitor, a general two-terminal MLCC and a low equivalent series inductance (ESL) MLCC. This PDN is referred to as a multi-stage PDN (see FIG. 23B).

The VRM, bulk capacitor and general two-terminal multilayer chip capacitor (MLCC) supply a current in a frequency range of several kHz, several kHz to hundreds of kHz, hundreds of kHz to several MHz, respectively and serve to lower impedance of the PDN. Unlike the bulk capacitor or general two-terminal MLCC directly installed on a motherboard, the low ESL MLCC is typically installed on a CPU package to supply a current in a frequency range of at least several MHz and reduce impedance. Finally, a die capacitor within the CPU supplies a current and lowers impedance of the PDN in a frequency higher than an effective frequency of the low ESL MLCC. The plurality of bulk capacitors, general two-terminal MLCC and low ESL MLCC are connected in parallel to one another.

FIG. 1 is a schematic graph illustrating magnitude of impedance Z with respect to frequency of a general multistage PDN. In each stage, the VRM, bulk capacitor, general two-terminal MLCC, low ESL MLCC and die capacitor have respective impedances $Z_{REG}$, $Z_{BLK}$, $Z_{MF}$, $Z_{PKG}$, and $Z_{DIE}$ determining the impedance of an entire PDN. Accordingly, as shown, impedance of an individual capacitor greatly affects an impedance profile of the entire PDN. Also, an impedance of a previous stage capacitor is associated with an impedance of a next stage capacitor to determine the impedance of the entire PDN. In designing the PDN, an impedance at the each stage cannot be determined independently but the impedance of the entire PDN should be considered. A general two terminal MLCC which has a relatively higher ESL is installed on a motherboard or CPU package for mid-frequency decoupling. Also, a low ESL MLCC is installed in the CPU package for high-frequency decoupling. In a case where the PDN is designed to satisfy impedance characteristics in a wider frequency range, a greater number of decoupling capacitors may be utilized to cover wide frequency ranges (see FIG. 23B).

FIG. 2 schematically illustrates a conventional motherboard apparatus having decoupling capacitors connected thereto by MPU power circuits. Referring to FIG. 2, a CPU, i.e., MPU chip 51 is surface-mounted on a package board 53 to form CPU packages 51 and 53. Theses CPU packages 51 and 53 are surface-mounted onto a motherboard 55. Circuit conductors such as power (PWR) planes, ground (GND) planes, vias are provided inside and on an outer surface of the motherboard 55 and the package board 53 to configure a power circuit. Also, bumps or pins 15 are utilized to electrically connect the components 53 and 55. Decoupling capacitors 10 and 20 of different types according to the frequency range are connected to this power circuit to form a multi-stage PDN. The low ESL MLCC 10 for high-frequency decoupling, for example, a low inductance ceramic capacitor (LICC) or an interdigital capacitor (IDC) may be disposed on a bottom of the CPU package 53. The general MLCC 20 for mid-frequency decoupling may be directly disposed on a top or bottom of the motherboard 55 in the vicinity of the CPU packages 51 and 53, or installed on the bottom of the CPU package 53.

As described above, to form the multi-stage PDN, the capacitors 10 and 20 of different structures according to each frequency range should be employed. Accordingly, mounting surfaces or mounting positions of the capacitor need to be different according to the each frequency range. Moreover, a greater number of the chip capacitors 10 and 20 are required to lower total impedance of the PDN to a target impedance or less.

SUMMARY OF THE INVENTION

An aspect of the present invention provides a multilayer chip capacitor capable of reducing a PDN impedance to a target impedance or less in a broad frequency range of hundreds of kHz to hundreds of MHz with a smaller number of capacitors.

An aspect of the present invention also provides a motherboard apparatus employing the multilayer chip capacitor as a decoupling capacitor.

An aspect of the present invention also provides a power distribution network which utilizes the multilayer chip capacitor to ensure easy design in a power distribution network and save costs and space required in designing and implementing the power distribution network.

According to an aspect of the present invention, there is provided a multilayer chip capacitor including: a capacitor body having a plurality of dielectric layers laminated therein, the capacitor body including first and second capacitor units arranged in a laminated direction; and first to fourth outer electrodes formed on side surfaces of the capacitor body, respectively, wherein the first and third outer electrodes have polarity identical to each other, and the second and fourth outer electrodes have polarity identical to each other but different from the polarity of the first outer electrode, wherein the first capacitor unit includes first and second inner electrodes alternately arranged in the capacitor body to oppose each other while interposing a corresponding one of the dielectric layers, the first and second inner electrodes connected to the first and second outer electrodes, respectively to have polarity different from each other, the second capacitor unit includes third and fourth inner electrodes alternately arranged in the capacitor body to oppose each other while interposing another corresponding one of the dielectric layers, the third and fourth inner electrodes connected to the third and fourth outer electrodes, respectively to have polarity different from each other, the first capacitor unit and the second capacitor unit are electrically insulated from each other in the multilayer chip capacitor, and the first capacitor unit operates in a first frequency range and the second capacitor unit operates in a second frequency range lower than the first frequency range.

The first capacitor unit may have a resonance frequency higher than a resonance frequency of the second capacitor unit.

The first capacitor unit may have a resonance frequency ranging from 5 MHz to 15 MHz and the second capacitor unit has a resonance frequency ranging from 100 kHz to 5 MHz. The first capacitor may have an equivalent series inductance of 150 pH or less. A total lamination number of the inner electrodes of the first capacitor unit may be smaller than a total lamination number of the inner electrodes of the second capacitor unit.

The first capacitor unit may be disposed in a lower part of the capacitor body and the second capacitor unit may be disposed above the first capacitor unit.

The first capacitor unit may include upper and lower portions, wherein the second capacitor unit is disposed between the upper and lower portions of the first capacitor unit and the upper and lower portions are disposed above and below the second capacitor unit. The first capacitor units may be disposed symmetrically in a laminated direction while interposing the second capacitor unit and the multilayer chip capacitor is horizontally symmetrical.

A pair of the first and second inner electrodes opposing each other in the first capacitor unit may define one layer, and a pair of the third and fourth inner electrodes opposing each other in the second capacitor unit may define another layer, wherein an ESL per layer of the first and second inner electrodes may be smaller than an ESL per layer of the third and fourth inner electrodes.

The first and second outer electrodes may be disposed on opposing first and second longer side surfaces of the capacitor body and the third and fourth outer electrodes may be disposed on opposing first and second shorter side surfaces.

The multilayer chip capacitor may be a four-terminal capacitor including a respective one of the first to fourth outer electrodes, wherein the first to fourth inner electrodes may be connected to the first to fourth outer electrodes, respectively by one lead. A current flowing in the first and second inner electrodes of the first capacitor unit may be perpendicular to a current flowing in the third and fourth inner electrodes of the second capacitor unit. Leads of the first and second inner electrodes of the first capacitor unit have widths greater than widths of leads of the third and fourth inner electrodes.

A plurality of the first and second outer electrodes may be arranged alternately on each of the longer side surfaces of the capacitor body, and the first and second inner electrodes may be connected to the plurality of first and second outer electrodes through leads, respectively, one of the third and fourth outer electrodes is disposed on each of the shorter side surfaces of the capacitor body, and the third and fourth inner electrodes are connected to the one of the third and fourth outer electrodes, through one lead, respectively. The multilayer chip capacitor may be a ten-terminal capacitor including four first outer electrodes, four second outer electrodes, one third outer electrode and one fourth outer electrode. The first and second inner electrodes adjacent to each other in a laminated direction may have leads disposed adjacent to each other in a laminated direction.

Each of the first and second inner electrodes may include at least two leads, wherein the leads of the first inner electrode are arranged in an interdigitated configuration, adjacent to the leads of the second inner electrode and connected to corresponding ones of the outer electrodes with identical polarity thereto, respectively, one third outer electrode is disposed on a first shorter side surface and one fourth outer electrode is disposed on a second shorter side surface, and the third and fourth inner electrodes are connected to the third and fourth outer electrodes, respectively through one lead.

Each of the first and second inner electrodes may have two leads led out to first and second longer side surfaces, respectively and connected to the first and second outer electrodes, respectively, in the each of the first and second inner electrodes, a corresponding one of the leads led out to the first longer side surface is arranged shifted to a position corresponding to the outer electrode immediately adjacent thereto, with respect to another corresponding lead led out to the second longer side surface, in the first capacitor unit, the leads led out to each of the first and second longer side surfaces are arranged in a zigzag shape with respect to each other along a laminated direction from the longer side surface, one third outer electrode is disposed on a first shorter side surface and one fourth outer electrode is disposed on a second shorter side surface and the third and fourth inner electrodes are connected to the third and fourth outer electrodes, respectively through one lead.

Each of the first and second inner electrodes may have one lead connected to the first and second outer electrodes, the first and second inner electrodes having the leads led out to an identical one of the side surfaces of the capacitor body and adjacent to each other in a laminated direction have the leads connected to the first and second outer electrodes adjacent to each other on the identical side surface, one third outer electrode is disposed on a first shorter side surface and one fourth outer electrode is disposed on a second shorter side surface and the third and fourth inner electrodes are connected to the third and fourth outer electrodes, respectively through one lead.

The first and third outer electrodes may be disposed on opposing first and second longer side surfaces of the capacitor body and the second and fourth outer electrodes are disposed on opposing first and second shorter side surfaces of the capacitor body. The multilayer chip capacitor may be a four-terminal capacitor having a respective one of the first to fourth outer electrodes, and the first and fourth inner electrodes are connected to the first to fourth outer electrodes, respectively through one lead. The multilayer chip capacitor may be a four-terminal capacitor having a respective one of the first to fourth outer electrodes, the first and third inner electrodes are connected to the first and third outer electrodes, respectively through one lead, and the second and fourth inner electrodes are connected to the second and fourth outer electrodes through two leads, respectively.

According to another aspect of the present invention, there is provided a motherboard apparatus including: a motherboard, a package board mounted on the motherboard, a central processing unit chip mounted on the package board and at least one multilayer chip capacitor described above which is connected to a power circuit for supplying power to the central processing unit and used as a decoupling capacitor.

The multilayer chip capacitor may be disposed on the package board. The multilayer chip may be disposed on a bottom surface of the package board. The multilayer chip capacitor may be disposed on a top surface of the package board. The multilayer chip capacitor may be directly mounted on the motherboard in the vicinity of the package board. The multilayer chip capacitor may be mounted on a bottom surface of the motherboard. The motherboard apparatus may employ the multilayer chip capacitor as a decoupling capacitor of the power circuit in place of a mid-frequency decoupling two-terminal chip capacitor and a high-frequency decoupling chip capacitor.

According to still another aspect of the present invention, there is provided a power distribution network including: a voltage regulator module, a digital switching circuit consuming power, and a power transfer circuit supplying power from the voltage regulator module to the digital switching circuit and including at least one multilayer chip capacitor, wherein the multilayer chip capacitor includes: a capacitor body having a plurality of dielectric layers laminated therein, the capacitor body including first and second capacitor units arranged in a laminated direction; and first to fourth outer electrodes formed on side surfaces of the capacitor body, respectively, wherein the first and third outer electrodes have polarity identical to each other, and the second and fourth outer electrodes have polarity identical to each other but different from the polarity of the first outer electrode, wherein the first capacitor unit includes first and second inner electrodes alternately arranged in the capacitor body to oppose each other while interposing a corresponding one of the dielectric layers, the first and second inner electrodes connected to the first and second outer electrodes, respectively to have polarity different from each other, the second capacitor unit includes third and fourth inner electrodes alternately arranged in the capacitor body to oppose each other while interposing another corresponding one of the dielectric layers, the third and fourth inner electrodes connected to the third and fourth outer electrodes, respectively to have polarity different from each other, the first capacitor unit and the second capacitor unit are electrically insulated from each other in the multilayer chip capacitor, and the first capacitor unit operates in a first frequency range and the second capacitor unit operates in a second frequency range lower than the first frequency range.

The digital switching circuit may be a central processing unit.

The first capacitor unit may have a resonance frequency ranging from 5 MHz to 15 MHz and the second capacitor unit may have a resonance frequency ranging from 100 kHz to 5 MHz.

BRIEF DESCRIPTION OF THE DRAWINGS

The above and other aspects, features and other advantages of the present invention will be more clearly understood from the following detailed description taken in conjunction with the accompanying drawings, in which:

FIG. 22A and 22B are cross-sectional views illustrating a motherboard apparatus when portions of decoupling capacitors are replaced according to still another exemplary embodiment of the invention, respectively;

FIGS. 23A and 23B are schematic circuit diagrams illustrating a power distribution network according to an exemplary embodiment of the invention and a conventional power distribution network, respectively;

DETAILED DESCRIPTION OF THE PREFERRED EMBODIMENT

Figure 1:
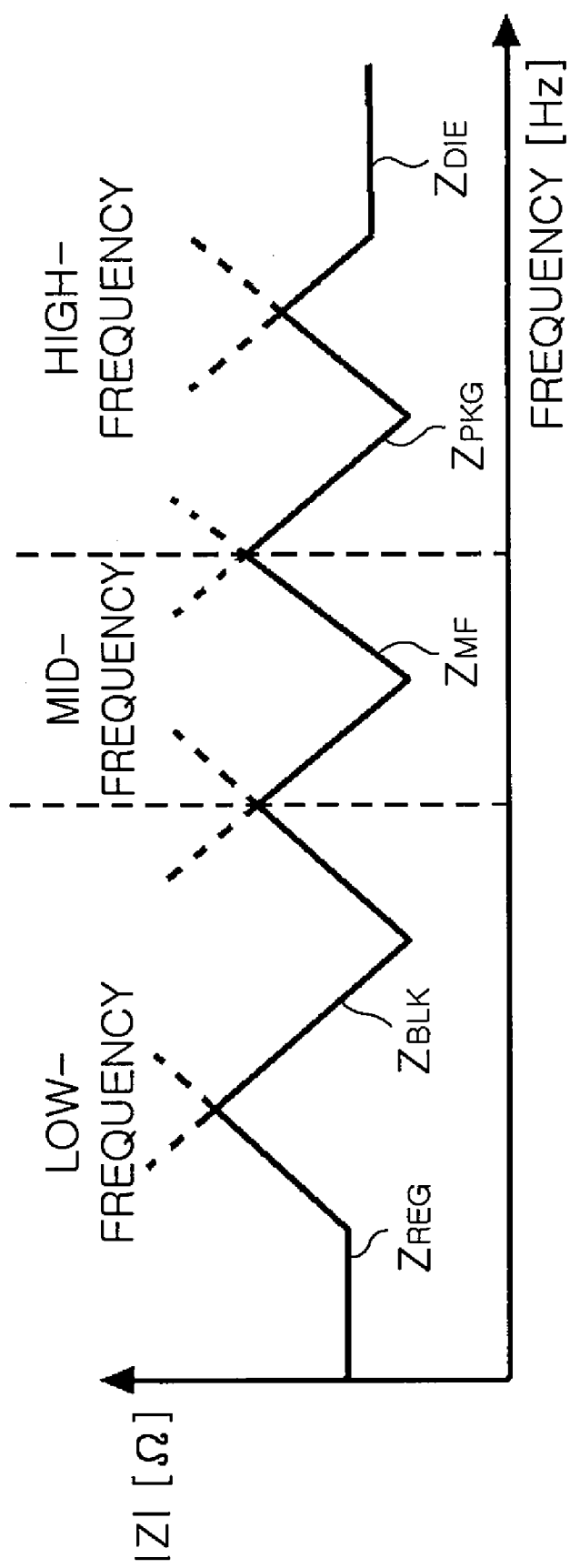
FIG. 1 is a graph schematically illustrating magnitude of impedance Z with respect to frequency of a conventional multi-stage power distribution network (PDN)

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 3:
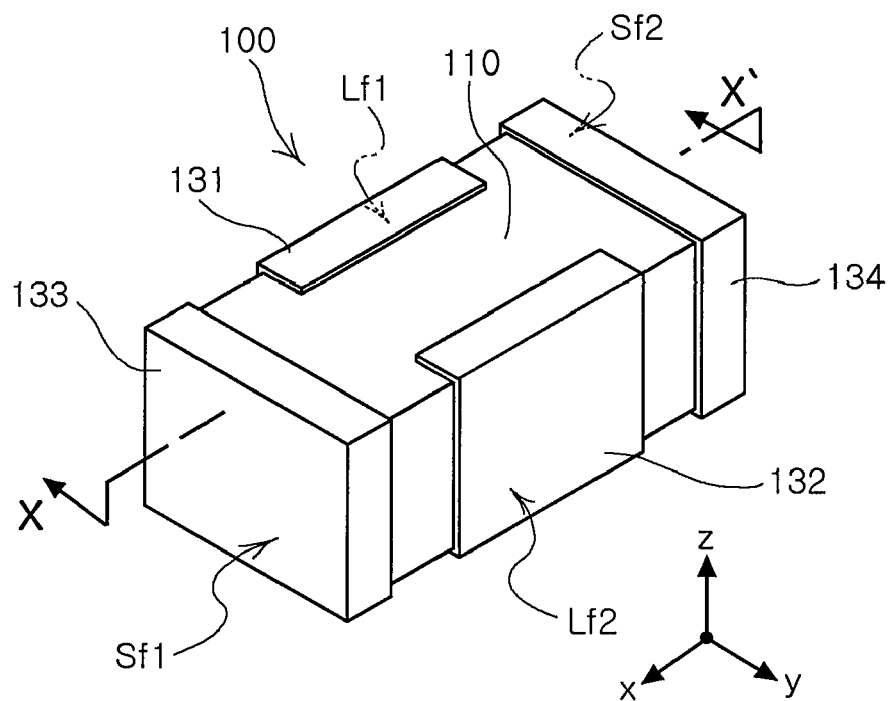
FIG. 3 is a perspective view illustrating the appearance of a multilayer chip capacitor according to an exemplary embodiment of the invention.
Figure 4:
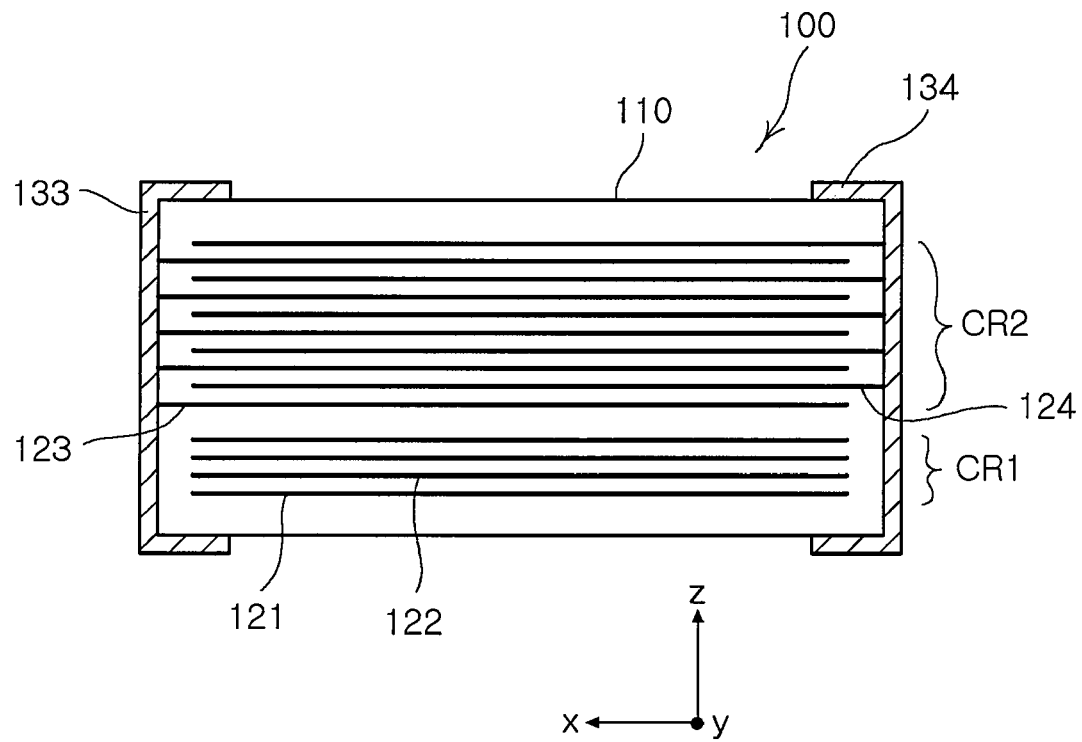
FIG. 4 is a cross-sectional view illustrating the capacitor of FIG. 3, taken along the line X-X'.
Figure 5:
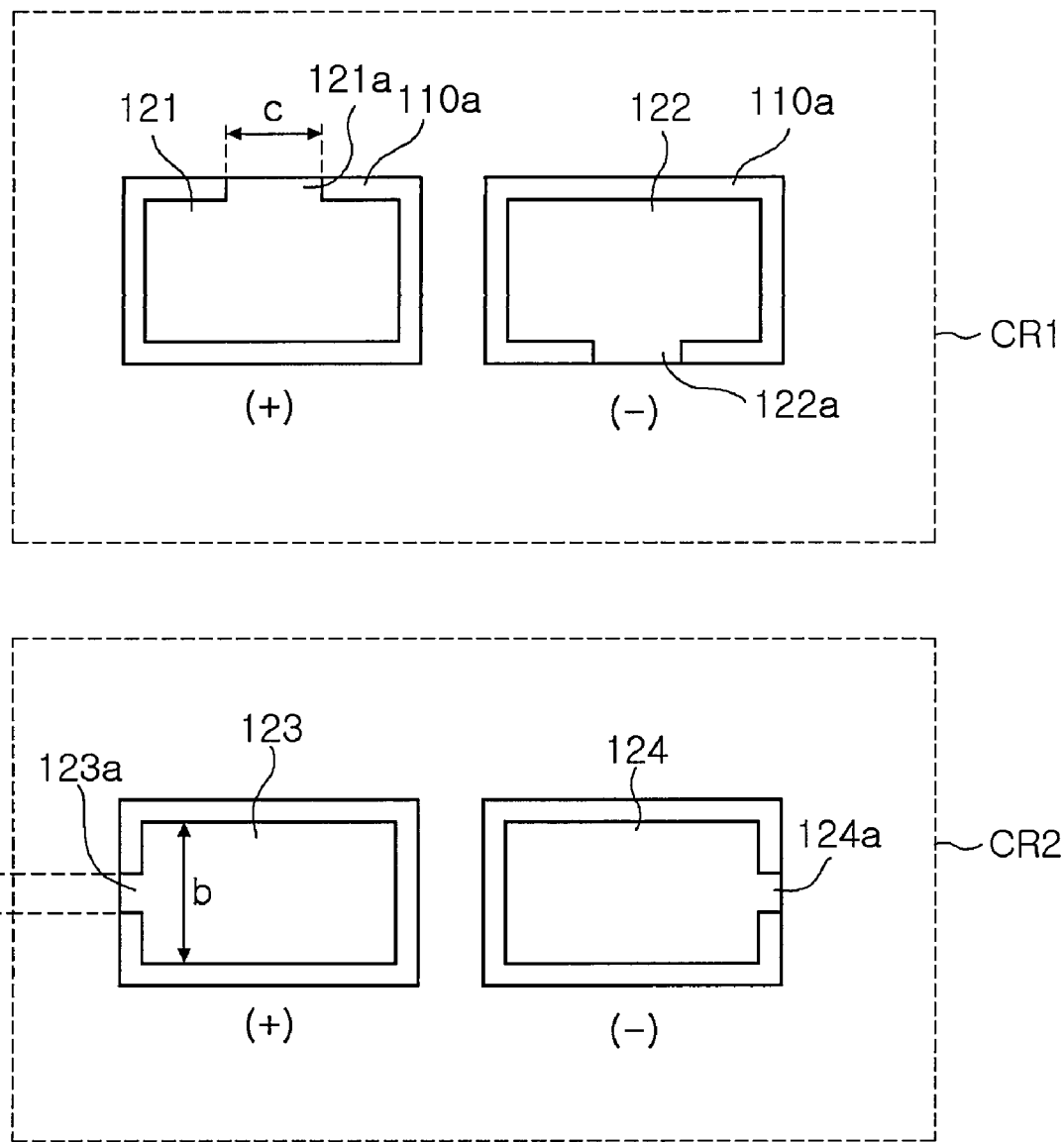
FIG. 5 is a plan view illustrating an inner electrode structure of the capacitor sown in FIG. 3.

FIG. 3 is a perspective view illustrating the appearance of a multilayer chip capacitor according to an exemplary embodiment of the invention. FIG. 4 is a cross-sectional view illustrating the capacitor of FIG. 3, taken along the line X-X'. FIG. 5 is a plan view illustrating an inner electrode structure of the capacitor shown in FIG. 3.

Referring to FIGS. 3 to 5, the capacitor 100 includes a capacitor body 110 shaped as a rectangular parallelepiped, and first to fourth outer electrodes 131, 132, 133, and 134 formed on side surfaces of the body. The capacitor body 110 has a plurality of dielectric layers (110a of FIG. 5) laminated therein and first to fourth inner electrodes 121, 122, 123, and 124 are arranged alternately while interposing a corresponding one of dielectric layers. The first and second outer electrodes 131 and 132 are disposed on opposing longer ones of the side surfaces Lf1 and Lf2 of the body 110. The third and fourth outer electrodes 133 and 134 are disposed on opposing shorter ones of the side surfaces Sf1 and Sf2. The capacitor 100 of the present invention is formed of a four-terminal capacitor having a total of four electrodes but the present invention is not limited thereto.

As shown in FIGS. 4 and 5, the capacitor body 110 includes a first capacitor unit CR1 and a second capacitor unit CR2 arranged along a laminated direction, i.e., z axis direction. The first capacitor unit CR1 includes the first and second inner electrodes 121 and 122 arranged alternately to oppose each other while interposing the dielectric layer 110a. The second capacitor unit CR2 includes the third and fourth inner electrodes 123 and 124 arranged alternately while interposing a corresponding one of the dielectric layers. The first inner electrode 121 and the second inner electrode 122 have different polarities from each other, and the third inner electrode 123 and the fourth inner electrode 124 have different polarities from each other.

In the first capacitor unit CR1, the first and second inner electrodes 121 and 122 are connected to the first and second outer electrodes 131 and 132 through leads 121a and 122a, respectively. Also, in the second capacitor unit CR2, the third and fourth inner electrodes 123 and 124 are connected to the third and fourth outer electrodes 133 and 134 through leads 123a and 124a, respectively. Therefore, the first and third outer electrodes 131 and 133 have polarities different from polarities of the second and fourth outer electrodes 132 and 134. The first and second inner electrodes 121 and 122 are directly connected to only the first and second outer electrodes 131 and 132, respectively but not directly connected to the third and fourth outer electrodes 133 and 134. Therefore, in the multilayer chip capacitor 100, the first capacitor unit CR1 and the second capacitor unit CR2 are electrically insulated from each other. That is, the first capacitor unit and the second capacitor unit are not electrically connected to each other before being mounted on a circuit board.

Each of the leads 123a and 124a of the third and fourth inner electrodes 123 and 124 may have a width a adjusted to control an equivalent series inductance (ESL) and an equivalent series resistance (ESR) of the second capacitor unit CR2. A greater width of the lead results in a greater width of a path of a current flowing through the lead, thereby reducing an ESL. Optionally, the widths a of the leads of the third and fourth inner electrodes may be increased by lengths b of shorter side surfaces of an overall main part of the inner electrodes. Here, the third and fourth inner electrodes 123 and 124 are shaped as a rectangle and connected in contact with the third and fourth outer electrodes 133 and 134 across the lengths b of the shorter side surfaces of the rectangle. In the same manner, each of the leads 121a and 122a of the first and second inner electrodes 121 and 122 may have a width adjusted to control an ESL and ESR of the second capacitor unit CR2. Also, the each of the leads 121a and 122a of the first and second inner electrodes may have a width expanded as much as lengths of longer side surfaces of the overall main part of the inner electrodes. Particularly, the current flowing through the capacitor at a high frequency is concentrated in the inner electrodes 121 and 122 located in a lower part of the capacitor body. Therefore, to ensure a low ESL, the leads of the inner electrodes 121 and 122 of the first capacitor unit CR1 may have widths c greater than widths a of the leads of the inner electrodes 123 and 124 of the second capacitor unit CR2.

Referring to FIGS. 3 and 5, a current in the inner electrodes 121 and 122 of the first capacitor unit CR1 flows from the lead 121a of the inner electrode 121 of positive (+) polarity to the lead 122a of the inner electrode 122 of negative (−) polarity in an y axis direction. A current in the inner electrodes 123 and 124 of the second capacitor unit CR2 flows from the lead 123a of the inner electrode 123 of positive polarity to the lead 124a of the inner electrode 124 of negative polarity in ax direction. Therefore, in the present embodiment, the current flowing in the inner electrodes 121 and 122 of the first capacitor unit CR1 is perpendicular to the current flowing in the inner electrodes 123 and 124 of the second capacitor unit CR2.

The first capacitor unit CR1 operates in a first frequency range and the second capacitor unit CR1 operates in a second frequency range lower than the first frequency range. The first frequency range and the second frequency range may be adjacent to each other at a multi-stage power distribution network (PDN). For example, the first frequency range is a frequency range covered by a decoupling capacitor most adjacent to a digital switching circuit such as a CPU. The second frequency range is a frequency range covered by a decoupling capacitor adjacent to the digital switching circuit next to the capacitor covering the first frequency range.

Particularly, the first capacitor unit CR1 has a resonance frequency SRF greater than a resonance frequency of the second capacitor unit CR2. Accordingly, to satisfy a target impedance, a capacitance of the first capacitor unit CR1 and an inductance of the second capacitor unit CR2 need to be adjusted. For example, to be effectively utilized as a decoupling capacitor satisfying a target impedance in a very broad frequency range covering a mid-frequency to a high frequency, the first capacitor unit CR1 may have a resonance frequency of 5 MHz to 15 MHz, and the second capacitor unit CR2 may have a resonance frequency of 100 kHz to 5 MHz.

When the capacitor 100 is mounted on a circuit board, the first capacitor unit CR1 and the second capacitor unit CR2 are connected in parallel. The first capacitor unit CR1 may have an ESL maintained at 150 pH or less, and particularly, 100 pH or less. Each capacitor unit can be controlled in inductance and capacitance to satisfy a target impedance in a frequency range dominated by the ESL of the second capacitor unit CR2 and in a frequency range dominated by the capacitance of the first capacitor unit CR1, respectively.

In the capacitor 100 described above, the first capacitor unit CR1 serves as a conventional low ESL two-terminal MLCC, i.e., low inductance chip capacitor (LICC). Also, the second capacitor unit CR2 serves as a conventional two terminal MLCC. Therefore, the capacitor 100 integrates the conventional two-terminal MLCC and the low ESL LICC into one chip. Consequently, a smaller number of these capacitors employed can reduce a PDN impedance to a target impedance or less in a wide frequency range, for example, hundreds of kHz to hundreds of MHz range. Particularly, as described above, the first and second capacitors electrically insulated from each other are employed in the one chip. This results in no substantial change in the number of capacitors although the two capacitor units CR1 and CR2 are integrated into one chip. This ensures the PND is easily designed to satisfy a target impedance and serves to further satisfy the target impedance.

Moreover, when the two terminal decoupling MLCC mounted on the motherboard and the low ESL decoupling MLCC mounted on the CPU package are integrated into the aforesaid capacitor 100, the number of the decoupling capacitors used in the PDN of the CPU can be significantly decreased. That is, since the second capacitor unit CR2 of the capacitor 100 performs mid-frequency decoupling, an additional two-terminal MLCC is not required for mid-frequency decoupling or the necessary number of the two terminal MLCC can be diminished. In the end, the capacitor 100 is employed in the PDN of the digital switching circuit such as the CPU to facilitate the design of the power distribution network. Also, a fewer number of the decoupling capacitors are utilized to implement the power distribution network. This reduces costs and space for implementing the power distribution network.

As shown in FIG. 4, the first capacitor unit CR1 is disposed in a lower part of the capacitor body 110 and the second capacitor unit CR2 is disposed above the first capacitor unit CR1. Here, the lower part of the capacitor body 110 is located in the vicinity of a mounting surface when the capacitor is mounted on a circuit board and an upper part of the capacitor body 110 is located opposite to the lower part.

Referring to FIG. 5, in the first capacitor unit CR1, the leads 121a and 122b of the inner electrodes 121 and 122 of different polarities adjacent to each other in a laminated direction have a small distance therebetween. On the other hand, in the second capacitor unit CR2, the leads 123a and 124a of the inner electrodes 123 and 124 of different polarities adjacent to each other in a laminated direction have a relatively greater distance therebetween. Therefore, generally, an ESL per layer of the first capacitor unit CR1 is lower than an ESL per layer of the second capacitor unit CR2. Here, the ESL per layer means an ESL provided by a pair of the adjacent inner electrodes opposing each other.

The first capacitor unit CR1 with a lower ESL per layer is disposed in a lower part and the second capacitor CR2 with a higher ESL per layer is disposed above the first capacitor unit CR1. This allows the current flowing in the capacitor at a high frequency to be concentrated in the inner electrodes 121 and 122 with a lower ESL per layer located in the lower part. This shortens a substantial current path and thus further reduces an overall ESL.

In most cases, the low ESL MLCC has a capacitance lower than the general two terminal MLCC used in the same motherboard apparatus. Accordingly, the lamination number of the inner electrodes 121 and 122 of the first capacitor unit CR1 may be smaller than the lamination number of the inner electrodes 123 and 124 of the second capacitor unit CR2.

Figure 6:
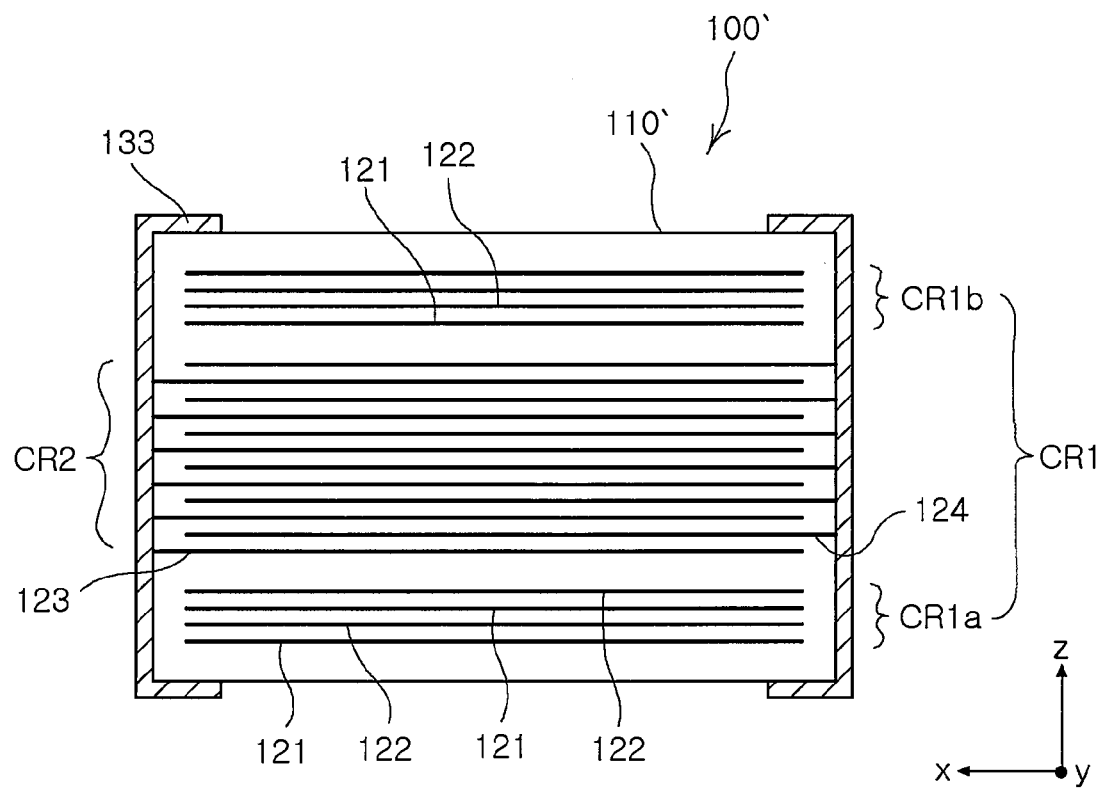
FIG. 6 is a cross-sectional view illustrating a modified example of the capacitor shown in FIG. 3.

FIG. 6 is a cross-sectional view illustrating a modified example of the capacitor shown in FIG. 3. The capacitor 100' of FIG. 6 also is shaped identically to the capacitor of FIG. 1 and can be compared with the cross-sectional view of FIG. 4. In the embodiment of FIG. 6, a first capacitor unit CR1 is divided into upper and lower portions and the second capacitor unit CR2 is disposed between the upper and lower portions of the first capacitor unit CR1.

As described above, a capacitor body 110' includes the first capacitor unit CR1 divided into the lower portion CR1a and the upper portion CR1b and a second capacitor unit CR2. The second capacitor unit CR2 is disposed between the upper and lower portions of the first capacitor unit CR1 and the first and second capacitor units CR1a, CR1b, and CR2 are laminated in a laminated direction. Accordingly, the lower and upper portions of the first capacitor unit CR1a and CR1b are disposed below and above the second capacitor unit CR2, respectively. Here, for convenience's sake, the first capacitor unit CR1 is construed to include the lower portion CR1a located below the second capacitor unit CR2 and the upper portion CR1b located above the second capacitor unit CR2 as described above.

First and second inner electrodes 121 and 122 are disposed in each of the lower and upper portions of the first capacitor unit CR1a and CR1b as described in FIG. 3. Third and fourth inner electrodes 123 and 124 are disposed in the second capacitor unit CR2 as shown in FIG. 3. From the inner electrode close to the mounting surface, the inner electrodes are laminated in an order of 121-122-121-122-121-122 . . . 123-124-123-124- . . . 121-122-121-122- . . . . Also, the lower and upper portions CR1a and CR1b of the first capacitor unit CR1 are arranged symmetrically in a laminated direction while interposing the second capacitor unit CR2, thus imparting horizontal symmetry to the multilayer chip capacitor 100'. Accordingly, the capacitor 100' can be mounted in a symmetrical configuration, thereby allowing the capacitor to be mounted on the mounting surface of a circuit board without the need to distinguish a top and bottom of the capacitor from each other.

Also in the present embodiment, the first capacitor unit CR1 operates in a first frequency range and the second capacitor unit CR2 operates in a second frequency range lower than the first frequency range. Particularly, the first capacitor unit CR1 has a resonance frequency higher than a resonance frequency of the second capacitor unit CR2. In order to effectively satisfy a target impedance in a wide frequency range of a middle frequency to a high frequency, the capacitor units CR1 and CR2 may have a resonance frequency of 5 MHz to 15 MHz and 100 kHz to 5 MHz, respectively. This allows mid-frequency decoupling, i.e., conventional two-terminal MLCC and high-frequency decupling, i.e., conventional low ESL MLCC to be achieved only with one chip. In the embodiment of FIG. 6, the first capacitor unit CR1 whose upper and lower portions sandwich the second capacitor unit CR2 employs the structure of the inner electrodes 121 and 122 of FIG. 4. However, the present invention is not limited thereto. For example, the first capacitor unit CR1: CR1a, CR1b of FIG. 6 may adopt an inner electrode structure of a first capacitor unit CR1 which will be described later with reference to FIGS. 10, 12 and 14 in place of the aforesaid inner electrodes 121 and 122.

Figure 7:
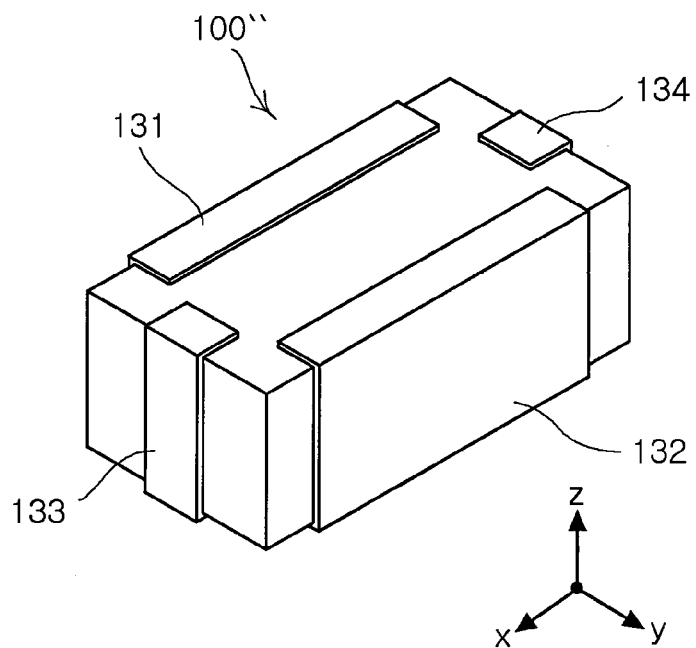
FIG. 7 is a perspective view illustrating another modified example of the capacitor shown in FIG. 3.

FIG. 7 is a perspective view illustrating another modified example of the capacitor shown in FIG. 3. The capacitor 100" of FIG. 7 includes first and second outer electrodes 131 and 132 with greater widths than the capacitor 100 of FIG. 3 and third and fourth outer electrodes 133 and 134 with smaller widths. The outer electrodes of FIG. 7 are suitable when leads of first and second inner electrodes 121 and 122 have greater widths c and leads of third and fourth inner electrodes 123 and 124 have smaller widths a. Particularly, the first and second inner electrodes whose leads have greater widths, i.e., inner electrodes of the first capacitor serve to decrease an ESL at a high frequency.

Figure 8:
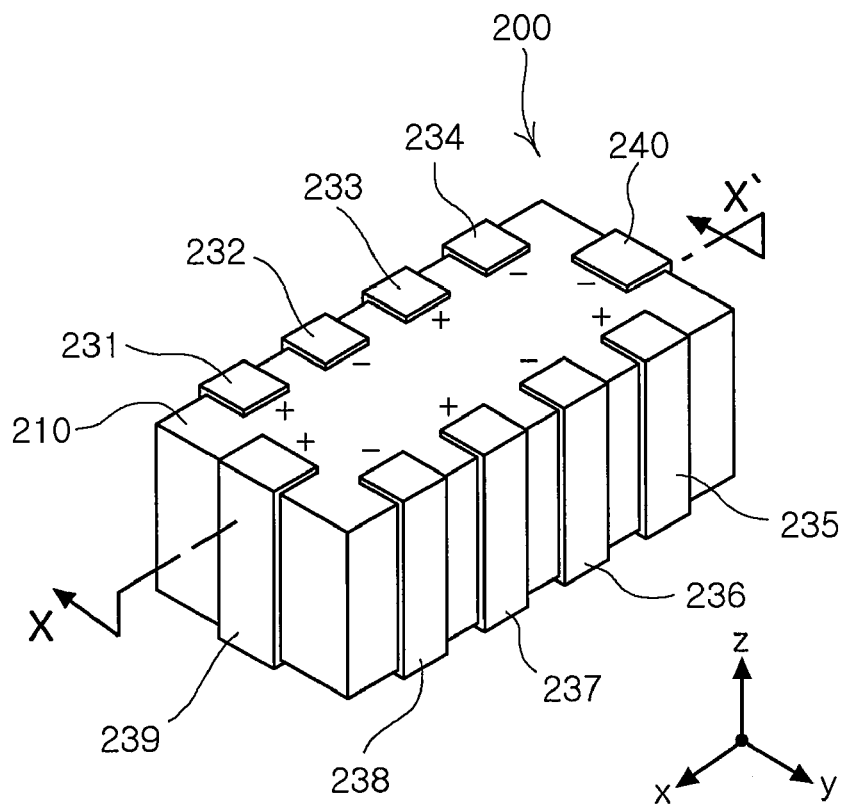
FIG. 8 is a perspective view illustrating the appearance of a multilayer chip capacitor according to another exemplary embodiment of the invention.
Figure 9:
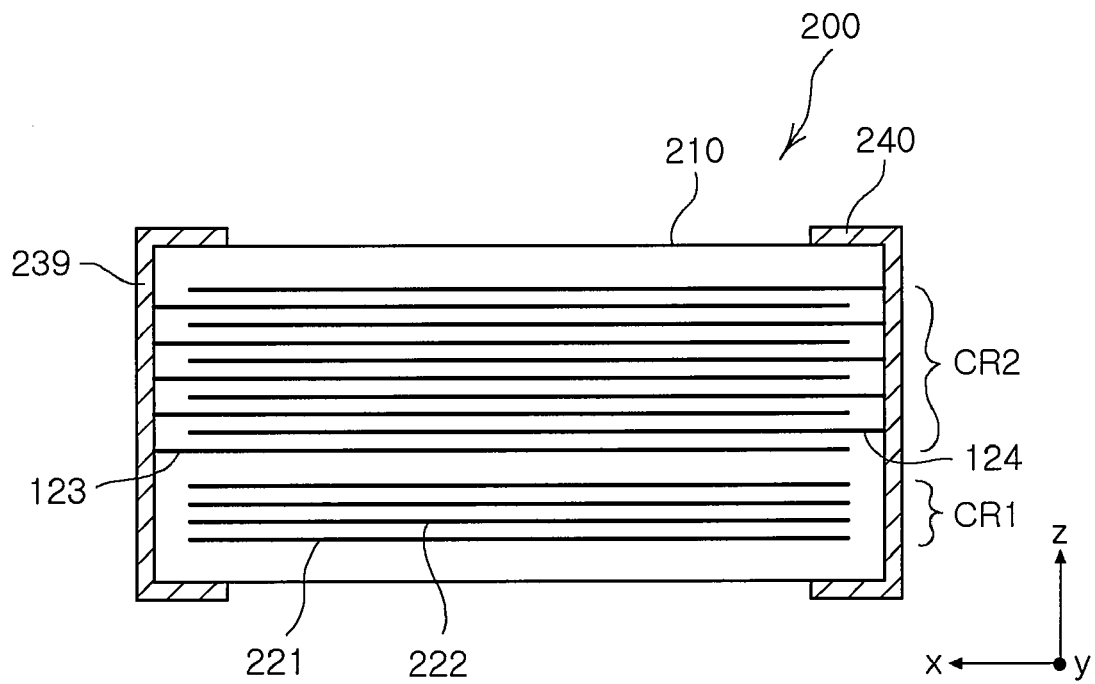
FIG. 9 is a cross-sectional view illustrating the capacitor of FIG. 8, taken along the line X-X'.
Figure 10:
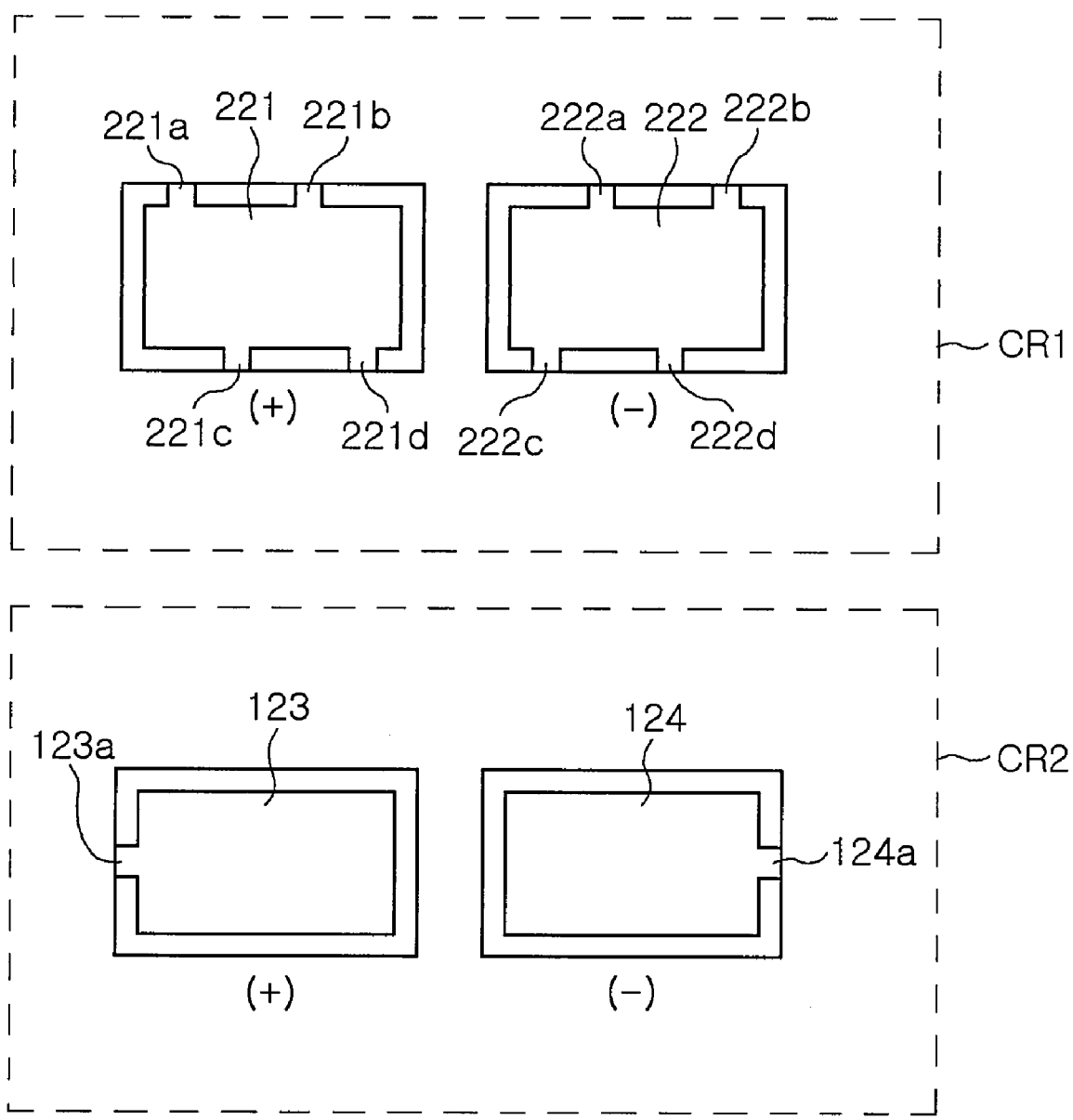
FIG. 10 is a plan view illustrating an inner electrode structure of the capacitor shown in FIG. 8.

FIG. 8 is a perspective view illustrating the appearance of a multilayer chip capacitor according to another exemplary embodiment of the invention. FIG. 9 is a cross-sectional view illustrating the capacitor of FIG. 8, taken along the line X-X'. FIG. 10 is a plan view illustrating an inner electrode structure of the capacitor shown in FIG. 8.

Referring to FIG. 8, a plurality of first outer electrodes 231 and 233 and second outer electrodes 232 and 234 are arranged alternately on a first longer side surface of a capacitor body 210. A plurality of first outer electrodes 235 and 237 and second outer electrodes 236 and 238 are arranged alternately on a second longer side surface of the capacitor body 210. Moreover, a third outer electrode 239 is disposed on a first shorter side surface and a fourth outer electrode 240 is disposed on a second shorter side surface. The first outer electrodes 231, 233, 235, and 237 have polarities different form polarities of the second outer electrodes 232, 234, and 236. The third outer electrode 239 has a polarity different from a polarity of the fourth outer electrode 240. The capacitor of the present embodiment is configured as a ten-terminal capacitor having the ten outer electrodes but the present invention is not limited thereto.

Referring to FIGS. 8 to 10, the capacitor body 200 includes a first capacitor unit CR1 and a second capacitor unit CR2 arranged along a laminated direction, i.e., z axis direction. The first capacitor unit CR1 includes first and second inner electrodes 221 and 222 of different polarities arranged alternately and the second capacitor unit CR2 includes third and fourth inner electrodes 123 and 124 structured identically to what has been described above. The first and second inner electrodes 221 and 222 of the first capacitor unit CR1 each have four leads. The first inner electrode 221 is connected to the first outer electrodes 231, 233, 235, and 237 through leads 221a, 221, 221c, and 221d and the second inner electrode 222 is connected to the second outer electrodes 232, 234, 236, and 238 through leads 222a, 222b, 222c, and 222d. In the second capacitor unit CR2, the third and fourth inner electrodes 123 and 124 are connected to the third and fourth outer electrodes 239 and 240 through a corresponding one of leads 123a and 124a, respectively. The inner and outer electrodes connected together as described above allow the first capacitor unit CR1 and the second capacitor unit CR2 to be electrically insulated from each other in the capacitor 200.

As shown in FIG. 10, the leads 221a, 221b, 221c, and 221d of the first inner electrode 221 are arranged in an interdigitated configuration, adjacent to the leads 222a, 222b, 222c, and 222d of the second inner electrode 222 and connected to the outer electrodes 231, 233, 235, and 237 of identical polarity.

Also, in the embodiment shown in FIGS. 8 to 10, the first capacitor unit CR1 operates in a first frequency range and the second capacitor unit CR2 operates in a second frequency range lower than the first frequency range. Particularly, the first capacitor unit CR1 has a resonance frequency higher than a resonance frequency of the second capacitor unit CR2. In order to effectively satisfy a target impedance in a wide frequency range covering a mid-frequency to a high frequency, the capacitor units CR1 and CR2 may have a resonance frequency of 5 MHz to 15 MHz, and 100 kHz to 5 MHz, respectively. The first capacitor unit CR1 may have ESL maintained at 150 pH or less and, particularly 100 pH or less. Each of the capacitor units can be controlled in inductance and capacitance to satisfy a target impedance in a frequency range dominated by ESL of the second capacitor unit CR2 and a frequency range dominated by capacitance of the first capacitor unit CR1.

In the capacitor 200, the inner electrode structure and resonance frequency range described above allow the first capacitor unit CR1 to serve as a conventional low ESL interdigital capacitor (IDC) and the second capacitor CR2 to serve as a conventional two terminal MLCC. Therefore, the capacitor 200 integrates the conventional two-terminal MLCC and the low ESL IDC into one chip. Consequently, a small number of these capacitors employed can reduce a PDN impedance to a target impedance or less in a frequency range of hundreds of kHz to hundreds of MHz.

Moreover, an ESL per layer of the first capacitor unit CR1 disposed in a lower part of the capacitor body 210 is smaller than an ESL per layer of the second capacitor unit CR2 disposed in an upper part of the capacitor body 210. This allows a current flowing in the capacitor at a high frequency to be concentrated in the inner electrodes 221 and 222 with a lower ESL per layer disposed in a lower part. This shortens a substantial current path and thus further reduces an overall ESL.

Figure 13:
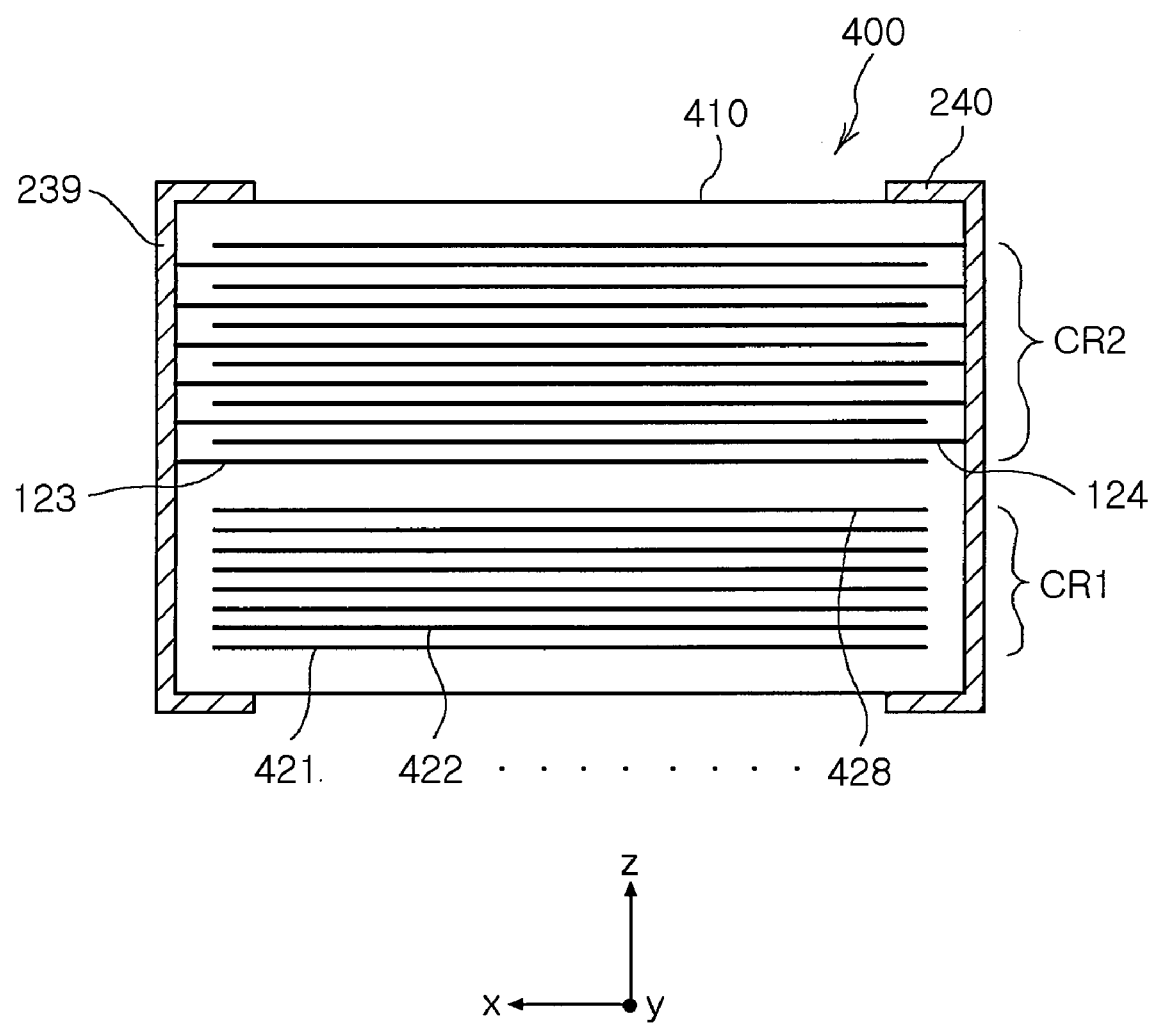
FIG. 13 is a cross-sectional view illustrating a multilayer chip capacitor according to yet another exemplary embodiment of the invention.
Figure 14:
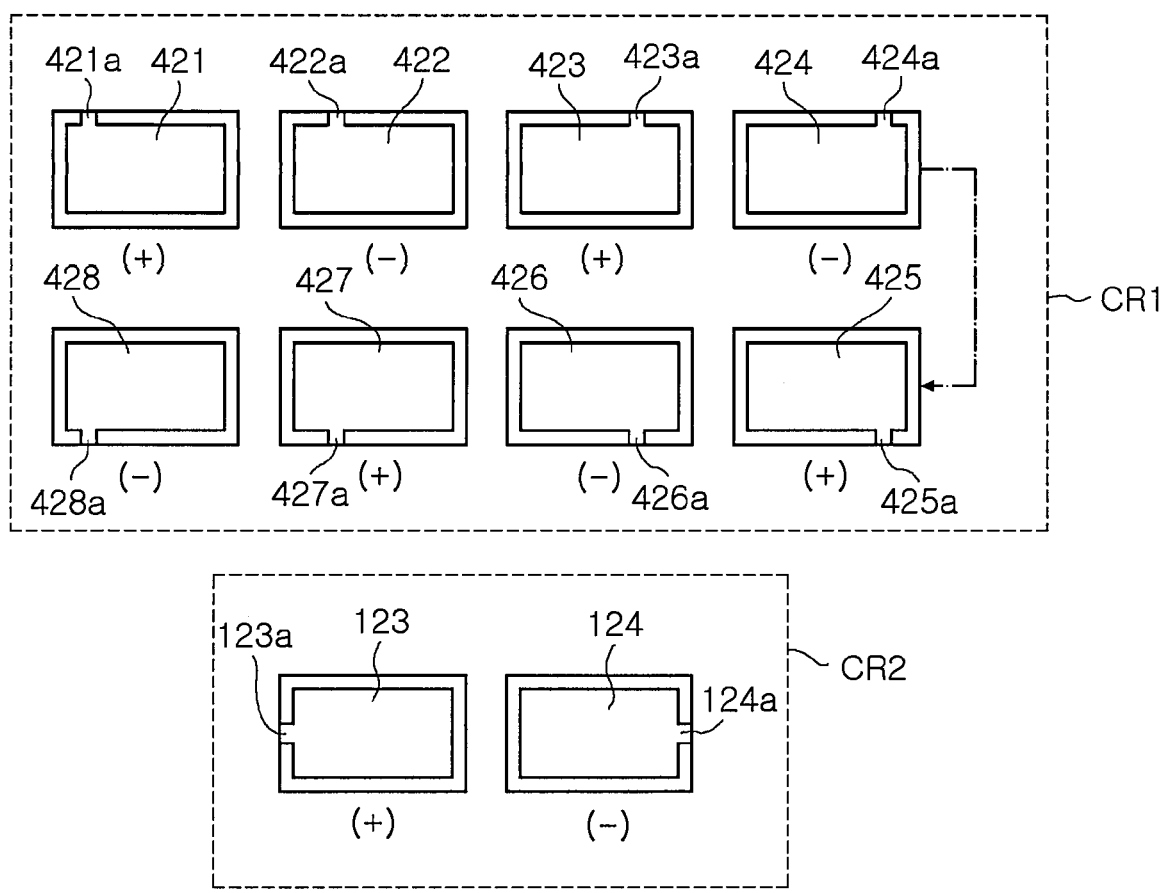
FIG. 14 is a plan view illustrating an inner electrode structure of the capacitor shown in FIG. 13.

The first capacitor unit CR1 of the capacitor 200 is not limited to a structure of the inner electrodes 221 and 222 having leads arranged in an interdigitated configuration. The first capacitor unit CR1 of the capacitor 200 may adopt the inner electrode structure of other configuration. For example, the first capacitor CR1 of the capacitor 200 may employ inner electrodes 321 to 326, or 421 to 428 structured as shown in FIGS. 12 to 14 in place of the inner electrodes 221 and 222 described above.

Figure 11:
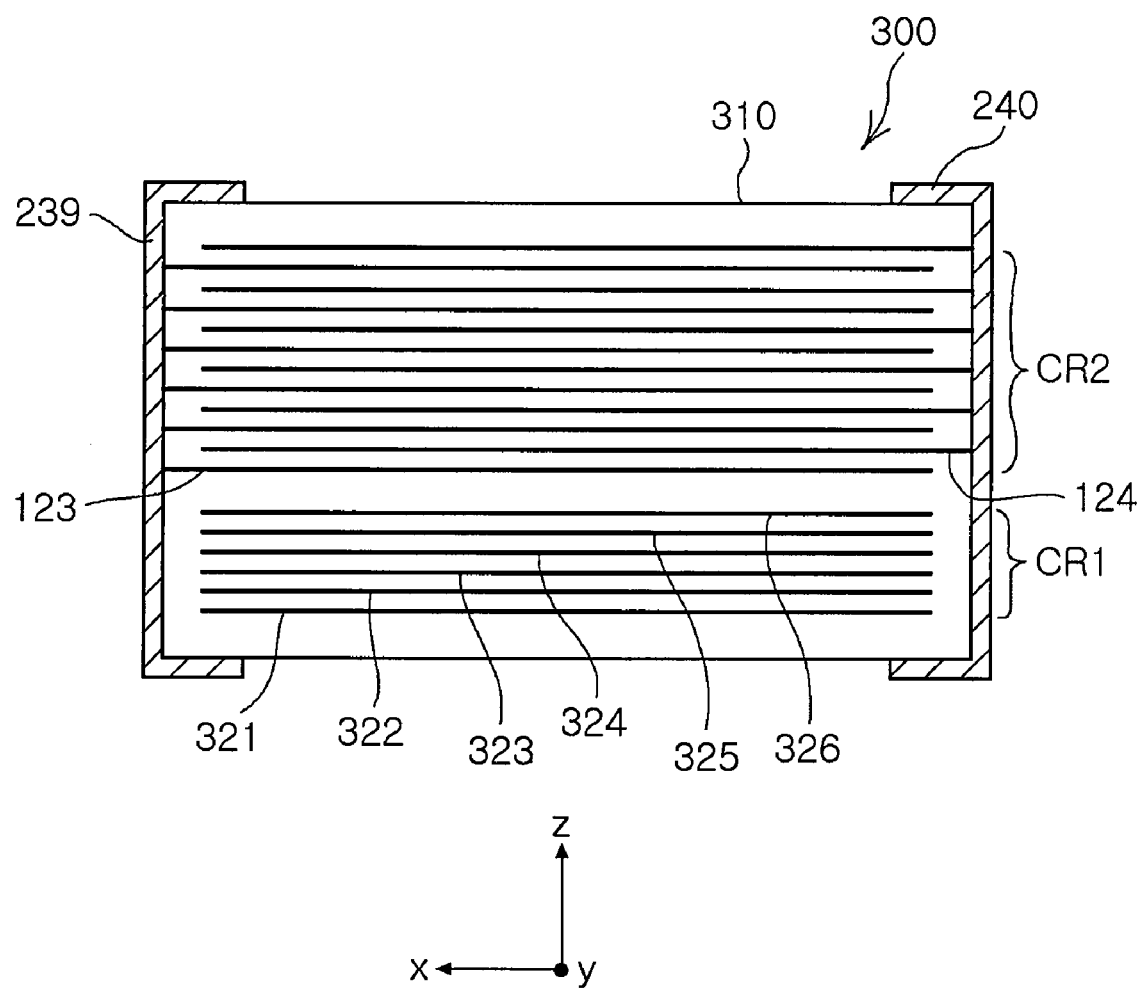
FIG. 11 is a cross-sectional view illustrating a multilayer chip capacitor according to still another exemplary embodiment of the invention.

FIG. 11 is a cross-sectional view illustrating a multilayer chip capacitor according to still another exemplary embodiment of the invention. FIG. 12 is a plan view illustrating an inner electrode structure of the capacitor shown in FIG. 11. The capacitor 300 is configured as a ten terminal capacitor in the same manner as the capacitor of FIG. 8.

Figure 12:
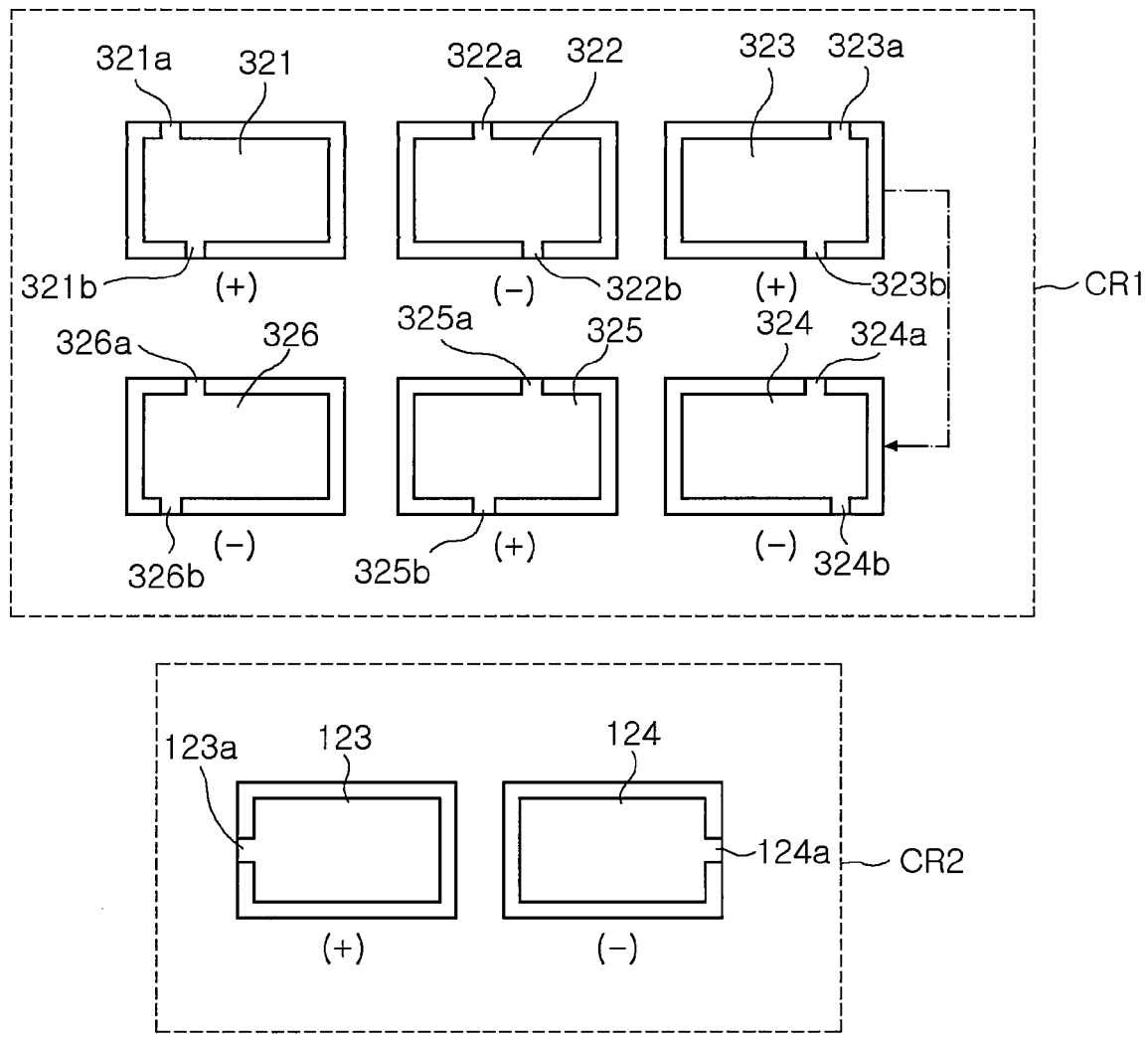
FIG. 12 is a plan view illustrating an inner electrode structure of the capacitor shown in FIG. 11.

Referring to FIGS. 11 and 12, in the same manner as the previous embodiment, a second capacitor unit CR2 in a lower part of the capacitor body 310 includes third and fourth inner electrodes 123 and 124 connected to third and fourth electrodes 239 and 240 through leads 123a and 124a, respectively. A first capacitor unit CR1 disposed in a lower part of the capacitor body 310 includes first inner electrodes 321, 323, and 325 of positive polarity and second inner electrodes 322, 324, and 326 of negative polarity arranged alternately with each other. These inner electrodes 321 to 326 structured in this fashion can be laminated repeatedly. Each of the inner electrodes 321 to 326 in the first capacitor unit CR1 includes one lead 321a to 326a led out to a first longer side surface and one lead 321b to 326b led out to a second longer side surface.

In the inner electrode structure of FIG. 12, the leads on the first and second longer side surfaces, respectively are arranged in a zigzag shape with respect to each other in a laminated direction. For example, the leads 321a to 326a led out to the first longer side surface are disposed to connect to the outer electrodes in the order of 231-232-233-234-233-232-231-232-233 along a laminated direction. This zigzag arrangement beneficially assures the leads of identical polarity adjacent to each other in a laminated direction, for example 322a and 326a to be reduced in mutual inductance. Also, in each of the inner electrodes 321 to 326, the lead, for example, 321a, led out to the first longer side surface is arranged shifted to a position corresponding to the outer electrode immediately adjacent thereto, with respect to the lead, for example, 321b led out to the second longer side. This zigzag arrangement and shifted arrangement of the leads allow the inner electrodes of identical polarity in the first capacitor unit CR1 to be electrically connected to one another. Also, according to the present embodiment, in the first capacitor unit CR1, the leads of the first and second inner electrodes, for example, 321 and 322 adjacent to each other in a laminated direction are disposed adjacent to each other in a laminated direction.

FIG. 13 is a cross-sectional view illustrating a multilayer chip capacitor according to yet another exemplary embodiment of the invention. FIG. 14 is a plan view illustrating an inner electrode structure of the capacitor shown in FIG. 13. The capacitor 400 of the present embodiment is configured as a ten terminal capacitor in the same manner as the capacitor of FIG. 8.

Referring to FIGS. 13 and 14, in the same manner as the previous embodiment, a second capacitor CR2 located in an upper part of a capacitor body 410 includes third and fourth inner electrodes 123 and 124 connected to third and fourth outer electrodes 239 and 240 through leads 123a and 124a, respectively.

A first capacitor unit located in a lower part of the capacitor body 410 includes first inner electrodes 421, 423, 425, and 427 of positive polarity and second inner electrodes 422, 424, 426, and 428 of negative polarity arranged alternately with each other. These inner electrodes 421 to 428 structured in this fashion can be laminated repeatedly. Each of the inner electrodes 421 to 428 in the first capacitor unit CR1 includes one lead 421a to 428a and is connected to a corresponding one of the outer electrodes 231 to 238 with identical polarity. The leads, for example, 421a and 422a of the inner electrodes of different polarities adjacent to each other in a laminated direction are led out to an identical side surface and arranged adjacent to each other to connect to adjacent ones of the outer electrodes, for example 231 and 232, on the identical side surface. Particularly, the leads 421a to 428a of the inner electrodes laminated sequentially are arranged sequentially in a clockwise direction along a periphery of the capacitor body 410 as shown in FIG. 14 and connected to the outer electrodes 231 to 238, respectively.

In the embodiments of FIGS. 12 and 14, the first capacitor unit CR1 operates in a first frequency range and the second capacitor unit CR2 operates in a second frequency range lower than the first frequency range. Particularly, the first capacitor unit CR1 has a resonance frequency higher than a resonance frequency of the second capacitor unit CR2. In order to effectively satisfy a target impedance in a wide frequency range covering a mid-frequency to a high frequency, the capacitor units CR1 and CR2 may have a resonance frequency of 5 MHz to 15 MHz and 100 kHz to 5 MHz, respectively. The first capacitor unit CR1 may have an ESL maintained at 150 pH or less and, particularly, 100 pH or less. Each of the capacitor units can be controlled in inductance and capacitance to satisfy a target impedance in a frequency range dominated by ESL of the second capacitor unit CR2 and a frequency range dominated by capacitance of the first capacitor unit CR1. The first capacitor unit CR1 of the capacitor 300 and 400 serves as a low ESL IDC. The second capacitor CR2 unit of the capacitor 300 and 400 serves as a conventional two terminal MLCC. The capacitor 300 and 400 integrates the conventional two terminal MLCC and the low ESL IDC into one chip. Consequently, a small number of these capacitors employed can reduce a PDN impedance to a target impedance or less in a frequency range of hundreds of kHz to hundreds of MHz.

Figure 15:
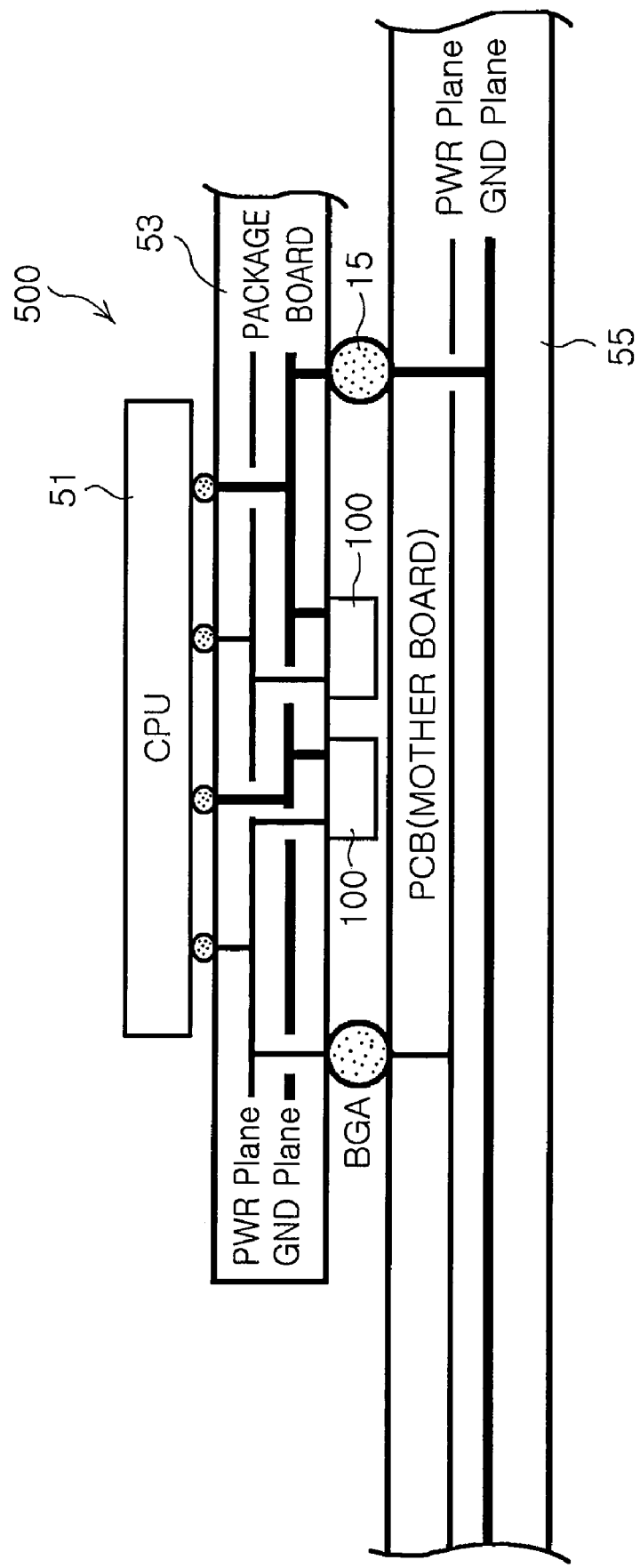
FIG. 15 is a cross-sectional view illustrating a motherboard apparatus according to an exemplary embodiment of the invention.

FIG. 15 is a cross-sectional view illustrating a motherboard apparatus according to an exemplary embodiment of the invention. Referring to FIG. 15, the motherboard apparatus includes a motherboard 55 and CPU packages 53 and 51 mounted thereon. The CPU packages 53 and 51 are formed of a package board 53 mounted on the motherboard 55 and a CPU, i.e., MPU chip 51 mounted thereon. Necessary circuits such as power (PWR) planes, ground (GND) planes and vias are formed inside and on a surface of the motherboard 55 and the package board 53 to supply power to the CPU, as shown. The power plane and ground plane of the package board 53 can be electrically connected to the power plane and the ground plane of the motherboard through vias and the bumps (or pins) 15.

As shown in FIG. 15, the multilayer chip capacitor 100 (see FIGS. 3 to 5) used as a decoupling capacitor can be mounted on the package board 53 and particularly on a bottom of the package board 53. The power plane of the package board 53 as indicated with a narrow solid line is electrically connected to the outer electrodes 131 and 133 of positive polarity of the aforesaid multilayer chip capacitor 100 through the circuit conductors such as the vias, and also electrically connected to the power terminal of a CPU. Moreover, the ground plane of the package board 53 as indicated with the thick solid line is electrically connected to the outer electrodes 132 and 134 of negative polarity of the multilayer chip capacitor 100 through the circuit conductors such as the vias, and also electrically connected to the ground terminal of the CPU. This circuit connection allows the capacitor 100 to be connected to the power of the CPU package, thereby acting as a decoupling capacitor.

The multilayer chip capacitors 100 of the motherboard apparatus 500 are configured as a single capacitor integrating a conventional two terminal MLCC and a low ESL MLCC (LICC or IDC) into one chip. The plurality of capacitors 100 are connected to one another in parallel through the circuit conductor. Therefore, this allows the motherboard apparatus 500 to substitute the conventional two terminal MLCC and the low ESL MLCC, and the multilayer chip capacitor 100 can be utilized to reduce a PDN impedance to a target impedance or less in a frequency range of hundreds of kHz to hundreds of MHz which cover a mid-frequency and a high frequency. In the motherboard apparatus 500, the one multilayer chip capacitor 100 can substitute at least one mid-frequency decoupling chip capacitor and at least one high-frequency decoupling chip capacitor. This significantly reduces the number of the decoupling multilayer chip capacitors utilized conventionally and thus ensures less costs for mounting the capacitor and the capacitors are mounted in a less overall space or occupy less mounting area.

Figure 16:
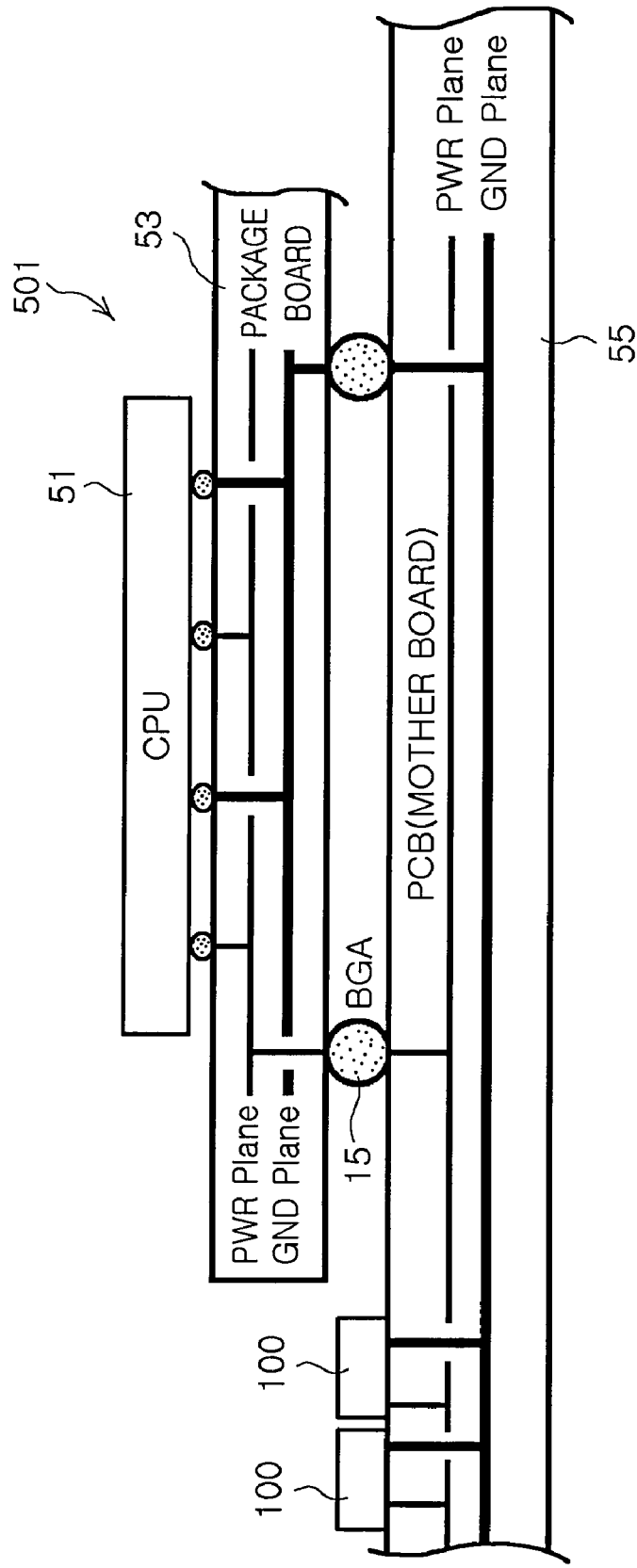
FIG. 16 is a cross-sectional view illustrating a motherboard apparatus according to another exemplary embodiment of the invention.

FIG. 16 is a cross-sectional view illustrating a motherboard apparatus according to still another embodiment of the invention. Referring to FIG. 16, a multilayer chip capacitor 100 is directly mounted on a motherboard 55 in the vicinity of a package board 53 to act as a decoupling capacitor in a frequency range of hundreds of kHz to hundreds of MHz which cover a mid-frequency to a high frequency. A power (PWR) plane of the motherboard 55 is connected to outer electrodes 131 and 133 of positive polarity of the capacitor 100 through circuits formed inside and on a surface of the motherboard. A ground plane of the motherboard 55 is connected to outer electrodes 132 and 134 of negative polarity of the capacitor 100 and connects the capacitor 100 to the power circuit of the CPU.

Figure 17:
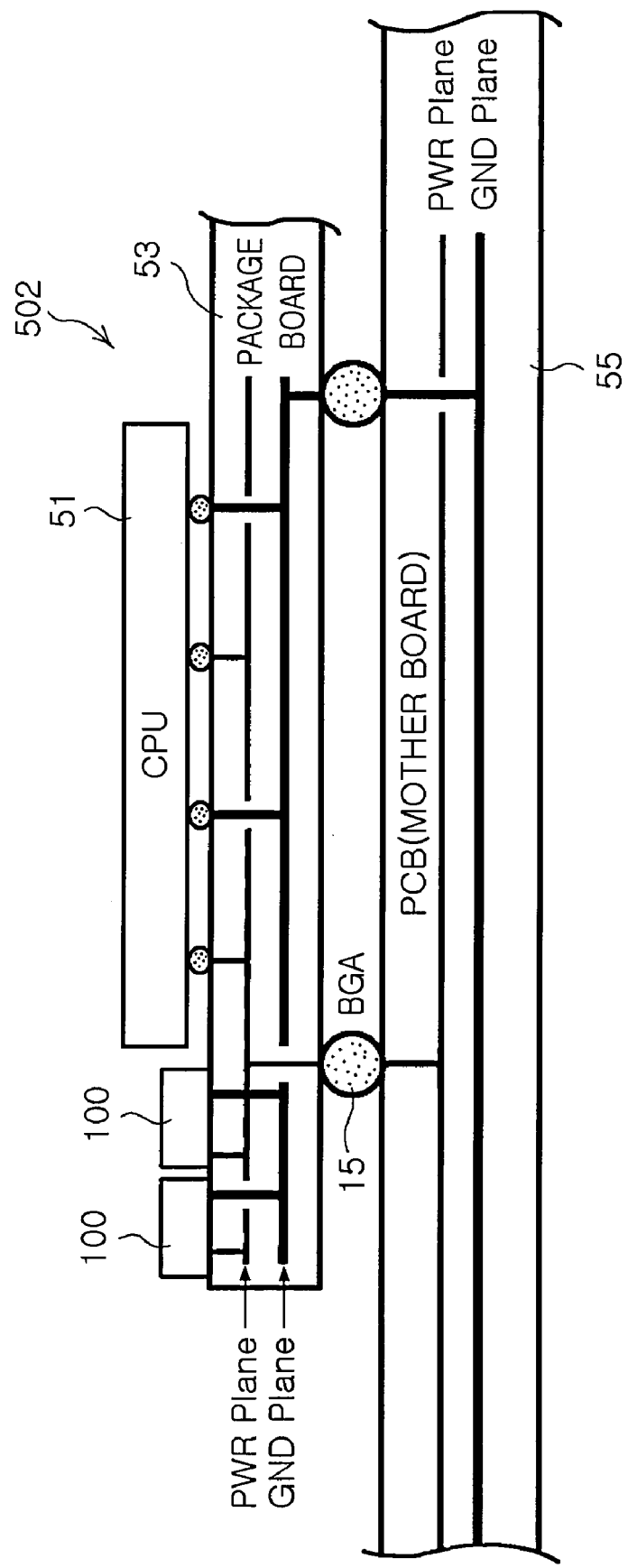
FIG. 17 is a cross-sectional view illustrating a motherboard apparatus according to still another exemplary embodiment of the invention.

FIG. 17 is a cross-sectional view illustrating a motherboard apparatus according to yet another embodiment of the invention. In the present embodiment, a multilayer chip capacitor 100 is mounted on a top of a package board 53 to act as a decoupling capacitor in a frequency range of hundreds of kHz to hundreds of MHz. A power (PWR) plane and a ground (GND) plane of the package board 53 are connected to outer electrodes of identical polarity of the capacitor 100 through a circuit conductor of the package board 53 to connect the capacitor 100 to a power circuit of a CPU.

Figure 18:
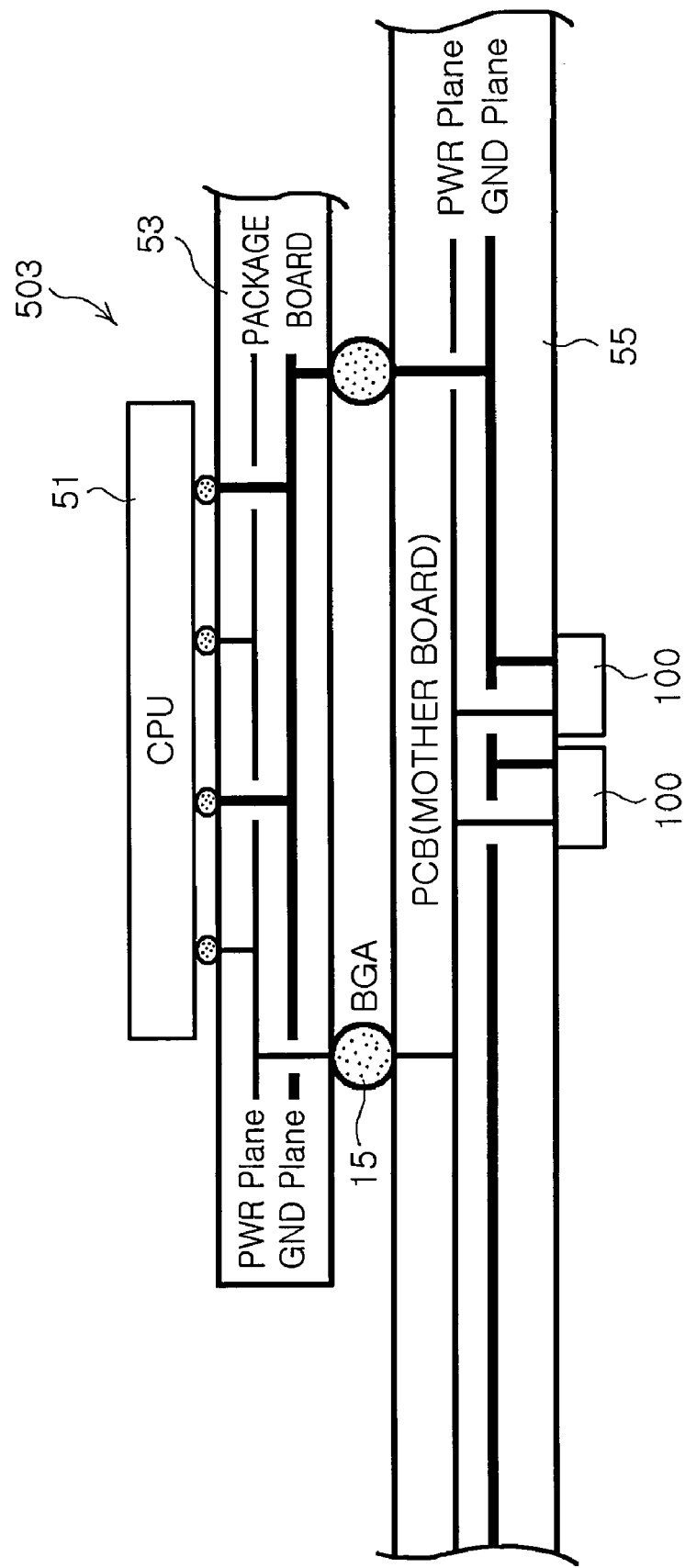
FIG. 18 is a cross-sectional view illustrating a motherboard apparatus according to yet another exemplary embodiment of the invention.

FIG. 18 is a cross-sectional view illustrating a motherboard apparatus 503 according to a further embodiment of the invention. In the present embodiment, a multilayer chip capacitor 100 is installed on a bottom of a motherboard. A power plane and a ground plane of a motherboard 55 connected to a power plane and a ground plane of a package board 53, respectively are connected to outer electrodes of identical polarity through circuit conductors of the motherboard 55 to connect the capacitor 100 to a power circuit of a CPU.

In the motherboard apparatus described with reference to FIGS. 15 to 18, the capacitor 100 may be substituted by the capacitors 100', 100", 200, 300, and 400 of the other embodiments. For example, the capacitor 200 employing the inner electrodes 221 and 222 each including four leads may be installed as the first capacitor unit CR1 in the motherboard apparatus 500, 501, and 502. The capacitor (see FIG. 6) in which the lower and upper portions of the first capacitor unit CR1a and CR1b are disposed in a lower and upper part of the capacitor body, respectively and the second capacitor unit CR2 is disposed therebetween may be installed in the motherboard apparatus 500, 501, and 502.

Figure 2:
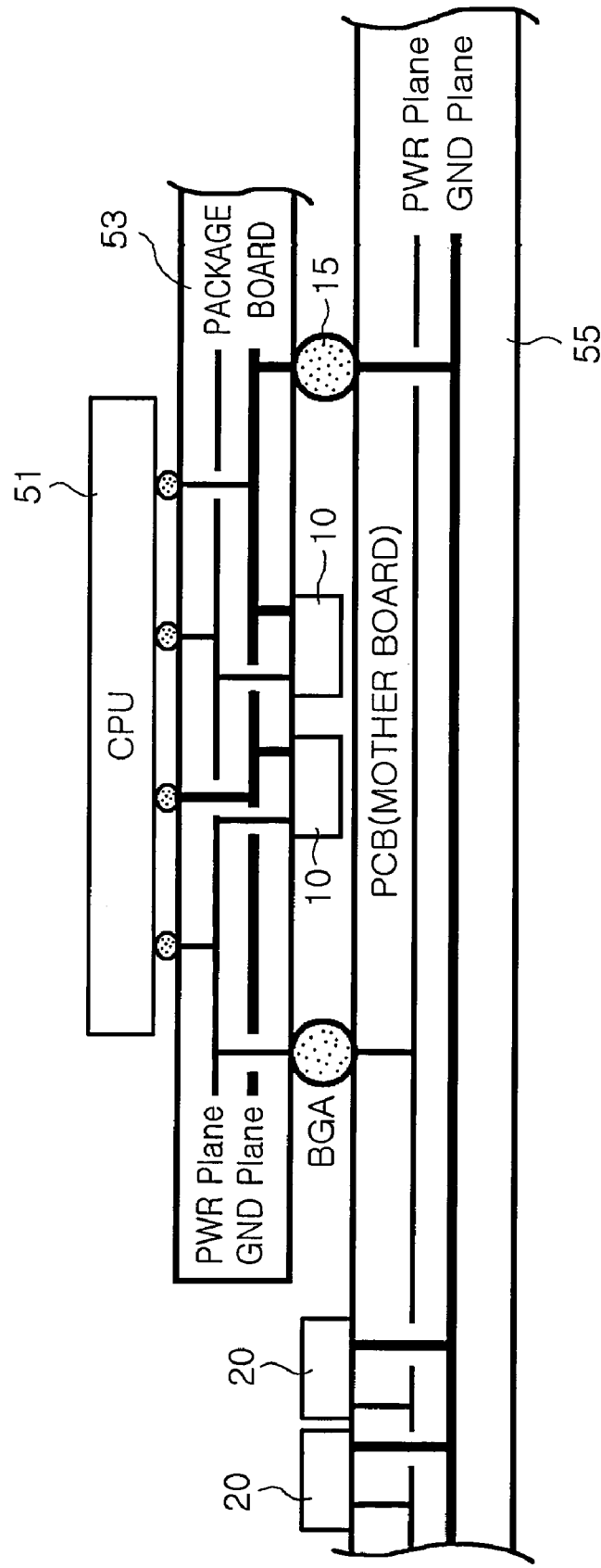
FIG. 2 is a cross-sectional view schematically illustrating a conventional motherboard apparatus.
Figure 19:
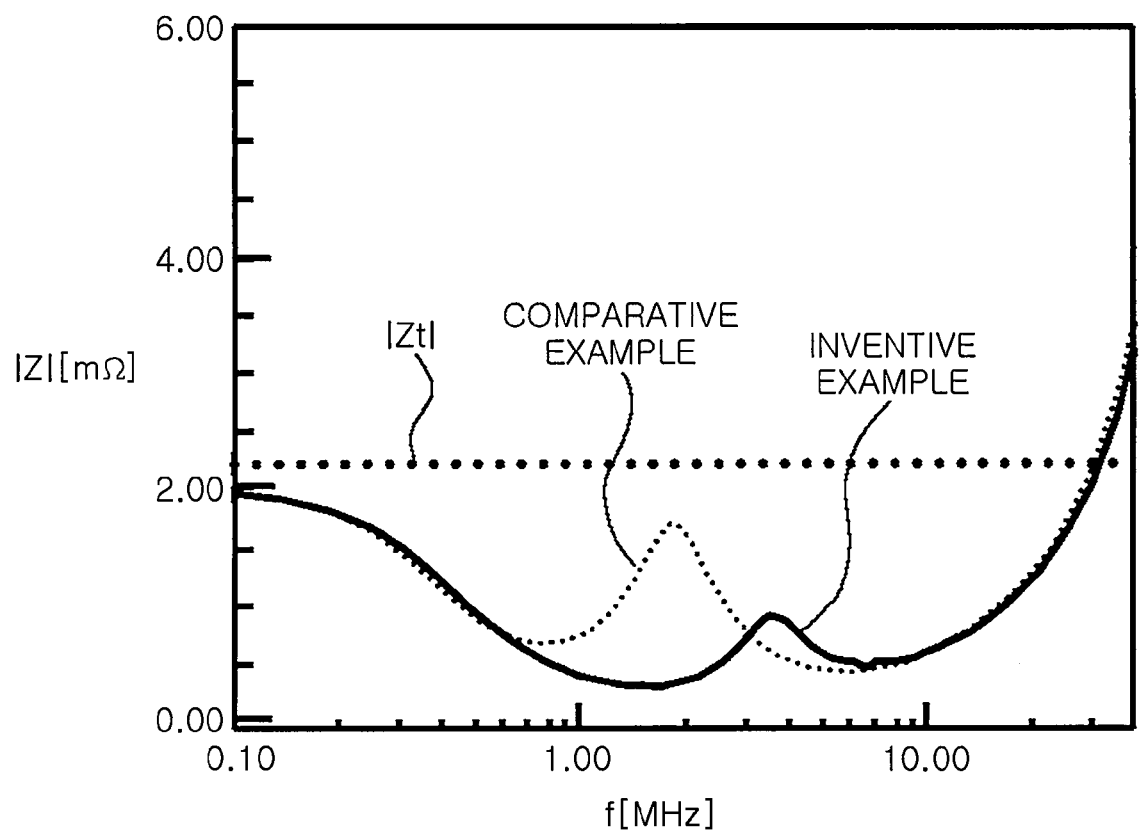
FIG. 19 is a graph illustrating impedance characteristics according to Inventive Example and Conventional Example.

FIG. 19 is a graph illustrating PND impedance characteristics of a CPU indicated with a curved line (solid line) when a multilayer chip capacitor was employed according to Inventive Example and PND impedance characteristics of a CPU indicated with a curved line (dotted line) when conventional decoupling capacitors were employed according to Comparative Example. The curved line of the Inventive Example was obtained by mounting the multilayer chip capacitor 100 as shown in FIG. 15. The curved line of the Comparative Example was obtained by employing the conventional two terminal MLCC chip 20 and the low ESL MLCC chip 10 as shown in FIG. 2. Referring to FIG. 19, in a wide frequency range covering a mid-frequency to a high frequency, the Inventive Example plots PND impedance |Z| that is equivalent to or less than a target impedance |Zt|. Also, the Inventive Example plots lower and more stable impedance in a range of 1 MHz to 10 MHz compared to the Comparative Example.

Figure 20A:
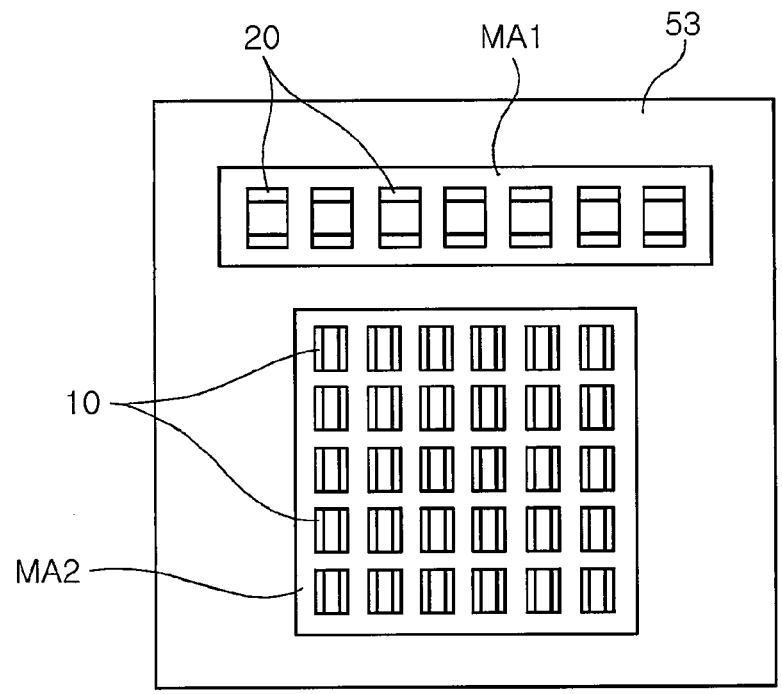
FIG. 20A and 20B are bottom views illustrating a mounting surface of a decoupling capacitor of a central processing unit (CPU) package when portions of decoupling capacitors are replaced according to an exemplary embodiment of the invention, respectively.
Figure 20B:
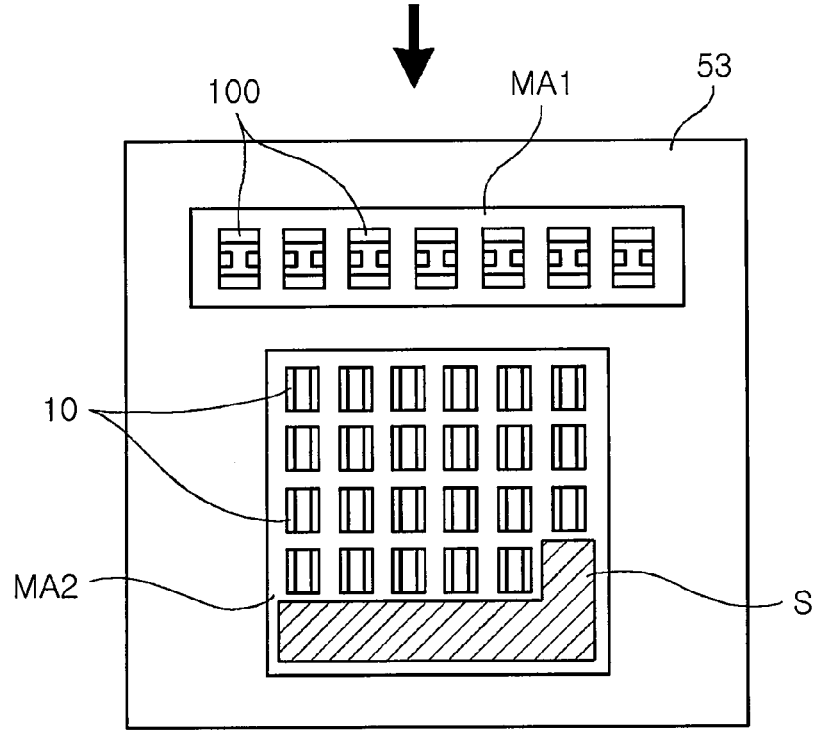

FIG. 20A and 20B are bottom views illustrating a mounting surface of a decoupling capacitor of a CPU package when portions of decoupling capacitors are replaced according to an exemplary embodiment of the invention, respectively.

As shown in FIG. 20A, as in the conventional arrangement of a decoupling capacitor, a conventional two terminal MLCC 20 is mounted in a mounting area MA1 on a bottom of a CPU package board 53 and a low ESL MLCC 10, for example LICC may be mounted in another mounting area MA2. With a change in this conventional arrangement, as shown in FIG. 20B, the capacitor 100 having the conventional two terminal MLCC and the low ESL capacitor integrated into one chip according to the present embodiment is mounted in the mounting area MA1, thus allowing a total of seven fewer capacitors to be mounted in the another mounting area MA2. This saves a mounting space or area S for mounting the capacitors of an equal number and requires a fewer number of mounting processes and lower costs.

Figures 21A, 21B:
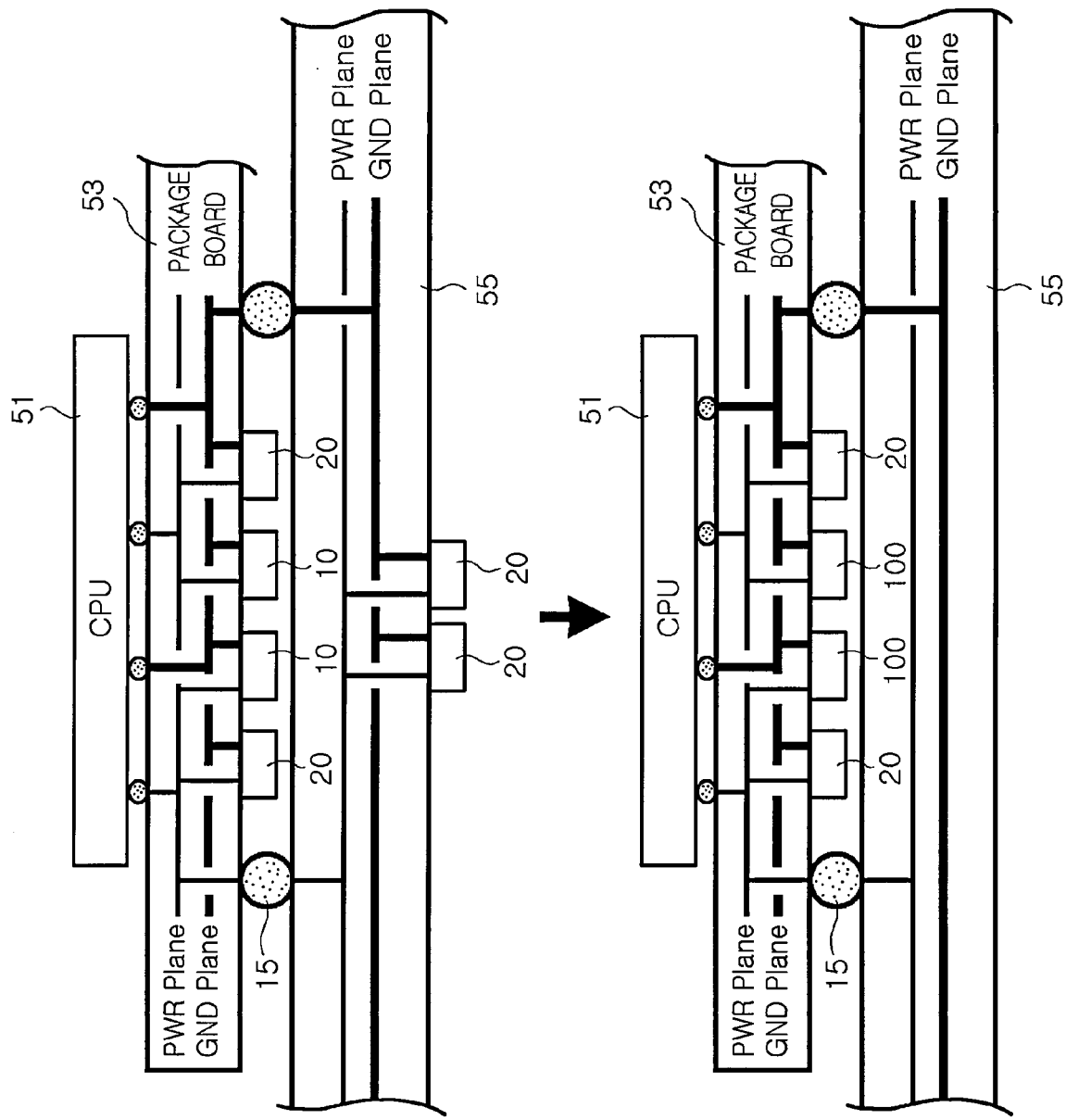
FIG. 21A and 21B are cross-sectional views illustrating a motherboard apparatus when portions of decoupling capacitors are replaced according to another exemplary embodiment of the invention, respectively.

FIG. 21A and 21B are cross-sectional views illustrating a motherboard apparatus when portions of decoupling capacitors are replaced according to another exemplary embodiment of the invention, respectively. FIG. 22A and 22B are cross-sectional views illustrating a motherboard apparatus when portions of decoupling capacitors are replaced according to still another exemplary embodiment of the invention, respectively. As shown in FIG. 21A and 21B, a conventional two terminal MLCC 20 mounted on a bottom of a motherboard 55 and a conventional ESL MLCC 10 mounted on a bottom of a board 53 of a CPU package are substituted by the capacitor 100 of the present embodiment and the capacitor 100 can be installed on a bottom of a package board 53. This effectively reduces a total number of necessary decoupling capacitors, amounting space and mounting costs. Also, as shown in FIGS. 22A and 22B, the low ESL MLCC 10 on the bottom of the package board 53 and the conventional two terminal MLCC 20 mounted on the bottom of the motherboard 55 may be substituted by the capacitor 100 of the present embodiment and the capacitor 100 can be mounted on the bottom of the motherboard 55.

In the motherboard apparatuses 500 to 503 of the embodiments described above, the first capacitor unit CR1 of the multilayer chip capacitor 100 does not necessarily operate in a high frequency range while the second capacitor unit CR2 does not necessarily operate in a mid-frequency range. More broadly, the first capacitor unit CR1 operates in a first frequency range and the second capacitor unit CR2 operates in a second frequency range lower than the first frequency range. Particularly, the first and second frequency ranges may be ones immediately adjacent to each other, out of a plurality of frequency ranges of a multistage PDN (see FIG. 23A).

FIGS. 23A and 23B are schematic circuit diagrams illustrating a power distribution network according to an exemplary embodiment of the invention and a conventional power distribution network, respectively. A power distribution network implemented in a circuit board of a digital system generally includes a plurality of decoupling capacitors electrically connected to a direct current (DC) voltage conductor and a ground conductor. As shown in FIGS. 23A and 23B, the power distribution network includes a voltage regulator module (VRM) providing a power terminal and a ground terminal connected to decoupling capacitors, a power transfer circuit having at least one multilayer chip capacitor supplying power from the VRM to a digital switching circuit, and the digital switching circuit, for example, a CPU consuming power.

As shown in FIG. 23B, in the conventional multi-stage power distribution network, in order to satisfy a target impedance in a broad frequency range, multilayer chip capacitors having different SRFs, i.e., resonance frequencies for each frequency range are connected in parallel to one another. For example, when the multilayer chip capacitors having different SRFs are referred to as a first capacitor, a second capacitor, ..., an Nth capacitor in the order of SRF, each of the first to Nth capacitors satisfies impedance characteristics in a corresponding one of frequency ranges (first to Nth frequency range). The multilayer chip capacitors with identical SRF operating in the each frequency range may differ in number. For example, the number of the multilayer chip capacitors operating in the first frequency range may be L, and the number of the multilayer chip capacitors operating in the second frequency range may be M.

Recently, an operating frequency of a digital switching circuit such as a CPU is increasingly higher, the digital switching circuit operates at a low voltage with more current consumption. This gradually requires the power distribution network to possess low impedance at a wider frequency. This means that the conventional power distribution network (see FIG. 23b) needs to employ a greater number of capacitors and the power distribution network should be implemented at higher costs and with more space.

However, the power distribution network (see FIG. 23A) of the present embodiment employs the multilayer chip capacitor 100, 100', 200, 300, and 400 of the embodiments described above. Accordingly, two capacitor units CR1 and CR2 operating in adjacent ones of the frequency ranges can be configured as a single capacitor chip. This allows the power distribution network to maintain impedance at a low level in a wide frequency range by virtue of a single capacitor. In the end, the power distribution network utilizing this capacitor can be easily designed and implemented with a small number of the multilayer chip capacitors, thereby saving costs and space for implementing the power distribution network.

As shown in FIG. 23A, the multilayer chip capacitor in which a first capacitor unit CR1 operating in a first frequency range and a second capacitor unit CR2 operating in a second frequency range lower than the first frequency are integrated into one chip can be disposed adjacent to the digital switching circuit (CPU). Accordingly, in place of the two types of chip capacitors, i.e., first and second capacitors necessary for the conventional power distribution network (see FIG. 23B) to satisfy impedance characteristics in first and second frequency ranges, a single multilayer chip capacitor is employed to satisfy a target impedance in the first and second frequency ranges. For example, the multilayer chip capacitor according to the present embodiment disposed in the power distribution network of FIG. 23A includes the first capacitor unit CR1 having an SRF of 5 MHz to 15 MHz and the second capacitor unit CR2 having an SRF of 100 kHz to 5 MHz, and can satisfy a target impedance in a wide frequency range from a mid-frequency to a high frequency.

Referring to FIG. 23A, the multilayer chip capacitor of the present embodiment is disposed most adjacent to the digital switching circuit. That is, the capacitor of the present embodiment is illustrated to operate in a highest frequency range and a second highest frequency range. However, the present invention is not limited thereto. For example, the multilayer chip capacitor of the present embodiment may be arranged such that the first and second capacitor units CR1 and CR2 operate in a third highest frequency and a fourth highest frequency, respectively. Generally, with a higher operating frequency, the multilayer chip capacitor is located more adjacent to the digital switching circuit.

Figure 24:
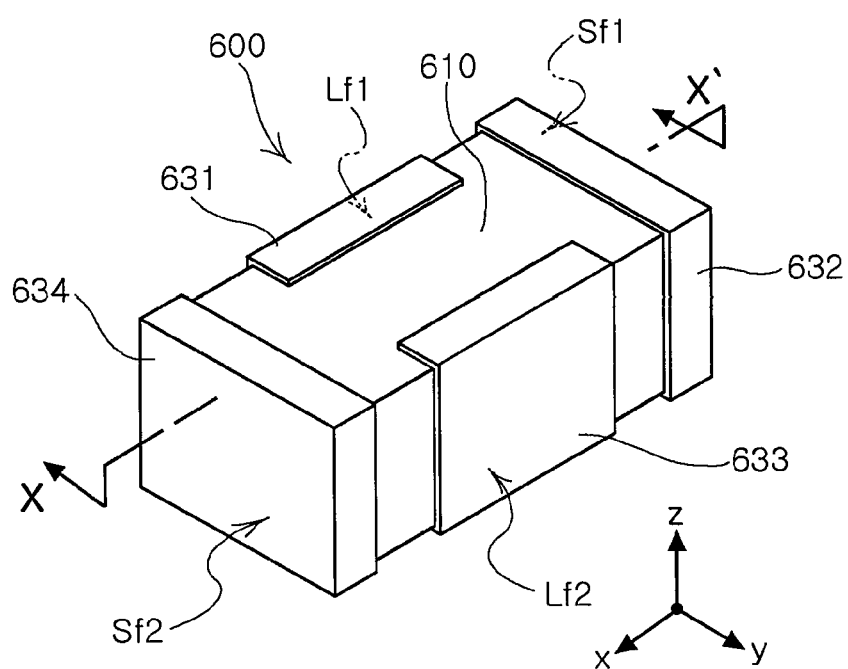
FIG. 24 is a perspective view illustrating the appearance of a multilayer chip capacitor according to a further exemplary embodiment of the invention.
Figure 25:
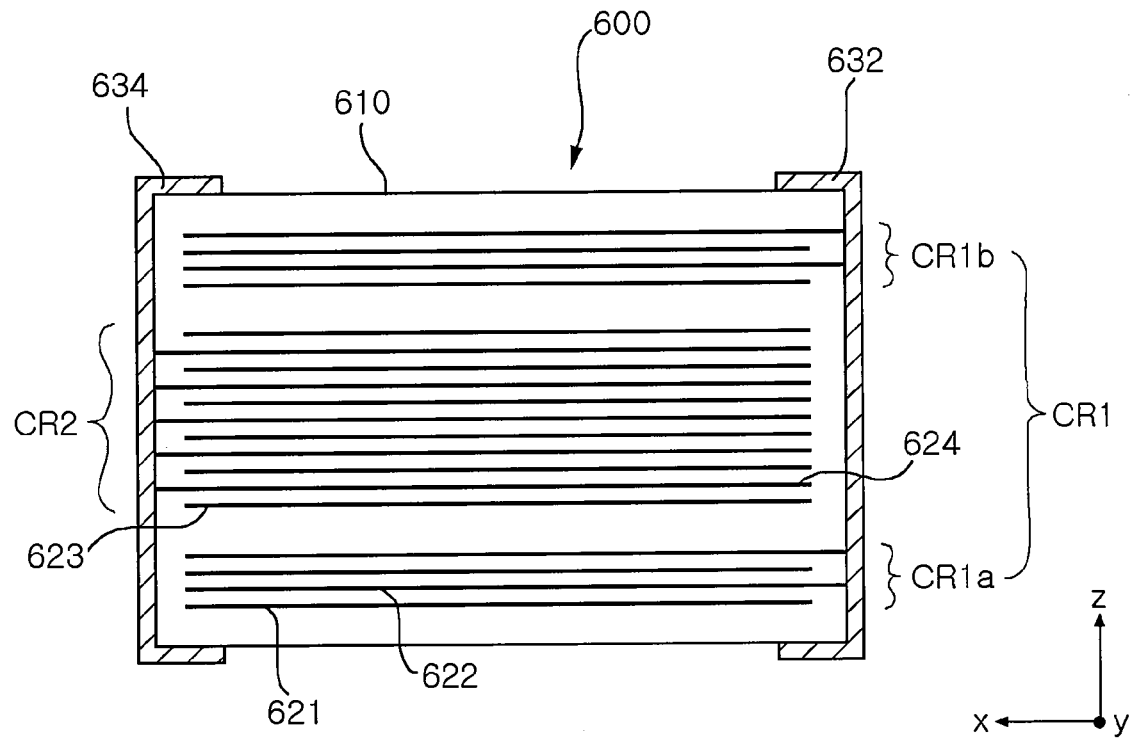
FIG. 25 is a cross-sectional view of the capacitor shown in FIG. 24.
Figure 26:
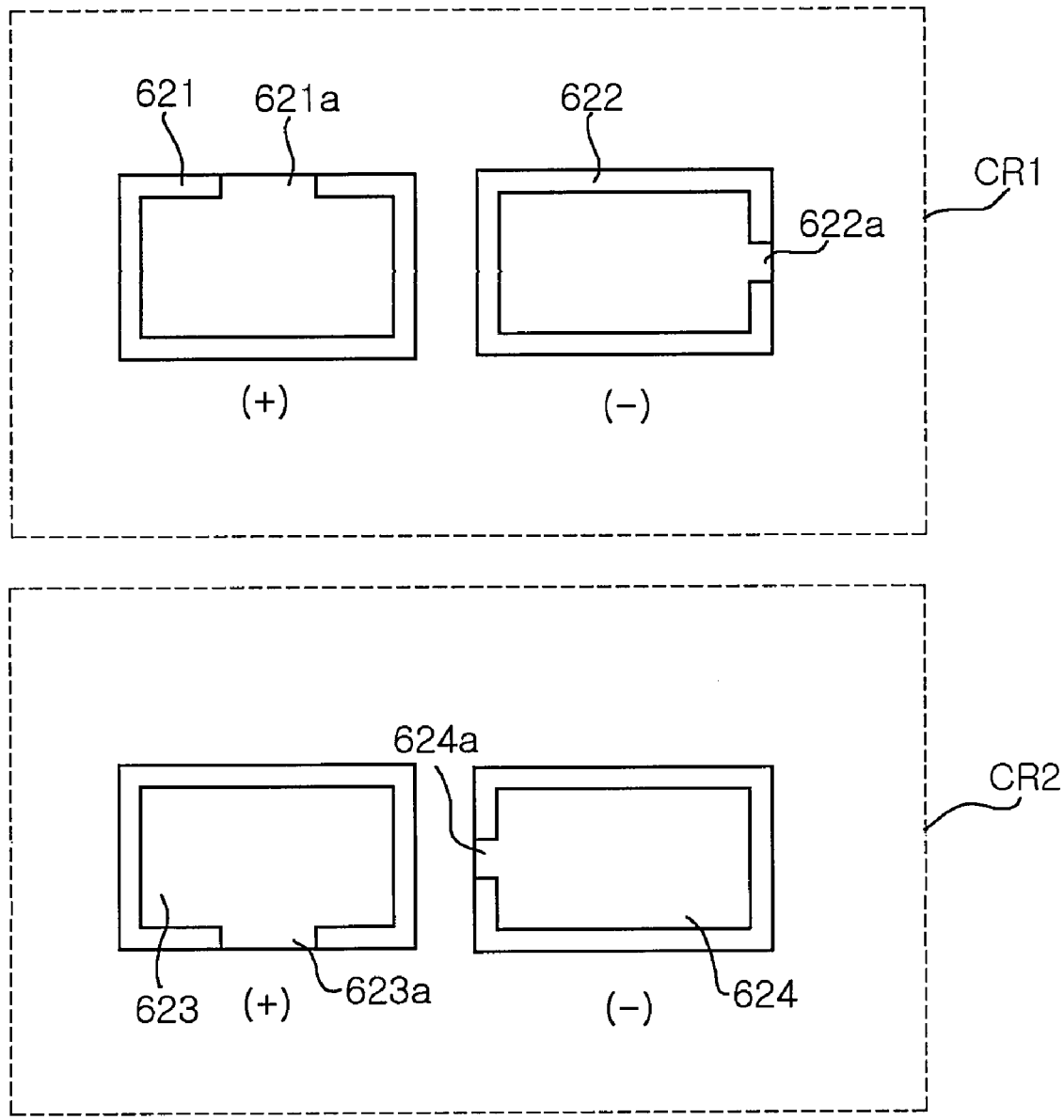
FIG. 26 is a plan view illustrating an inner electrode structure of the capacitor shown in FIG. 24.

FIG. 24 is a perspective view illustrating the appearance of a multilayer chip capacitor according to a further exemplary embodiment of the invention. FIG. 25 is a cross-sectional view of the capacitor shown in FIG. 24. FIG. 26 is a plan view illustrating an inner electrode structure of the capacitor shown in FIG. 24.

As shown in FIG. 24, a multilayer chip capacitor 600 is configured as a four-terminal capacitor including first and third outer electrodes 631 and 633 disposed on opposing first and second longer side surfaces Lf1 and Lf2 of a capacitor body 610, respectively and second and fourth outer electrodes 632 and 634 disposed on opposing first and second shorter side surfaces Sf1 and Sf2 of the capacitor body 610.

Referring to FIG. 25, a first capacitor unit CR1 operating in a first frequency range includes first and second inner electrodes 621 and 622 and a second capacitor unit CR2 operating in a second frequency range lower than the first frequency range includes third and fourth inner electrodes 623 and 624. In the same manner as the embodiments described above, in order to satisfy a target impedance effectively in a wide frequency range from a mid-frequency to a high frequency, the capacitor units CR1 and CR2 may have a resonance frequency ranging from 5 MHz to 15 MHz, and from 100 kHz to 5 MHz, respectively.

Referring to FIGS. 24 to 26, the first inner electrode 621 of first polarity, for example, positive polarity is connected to the first outer electrode 631 through a lead 621a and the second inner electrode 622 of second polarity, for example, negative polarity is connected to the second outer electrode 632 through a lead 622a. The third inner electrode 623 of first polarity is connected to the third outer electrode 633 through a lead 623a and the fourth inner electrode 624 of the second polarity is connected to the fourth outer electrode 634 through a lead 624a. Referring to FIG. 25, the capacitor 600 has a horizontally symmetrical configuration but the present invention is not limited thereto. For example, only a lower part CR1a of the first capacitor unit CR1 may be employed by omitting an upper portion CR1b.

Figure 27:
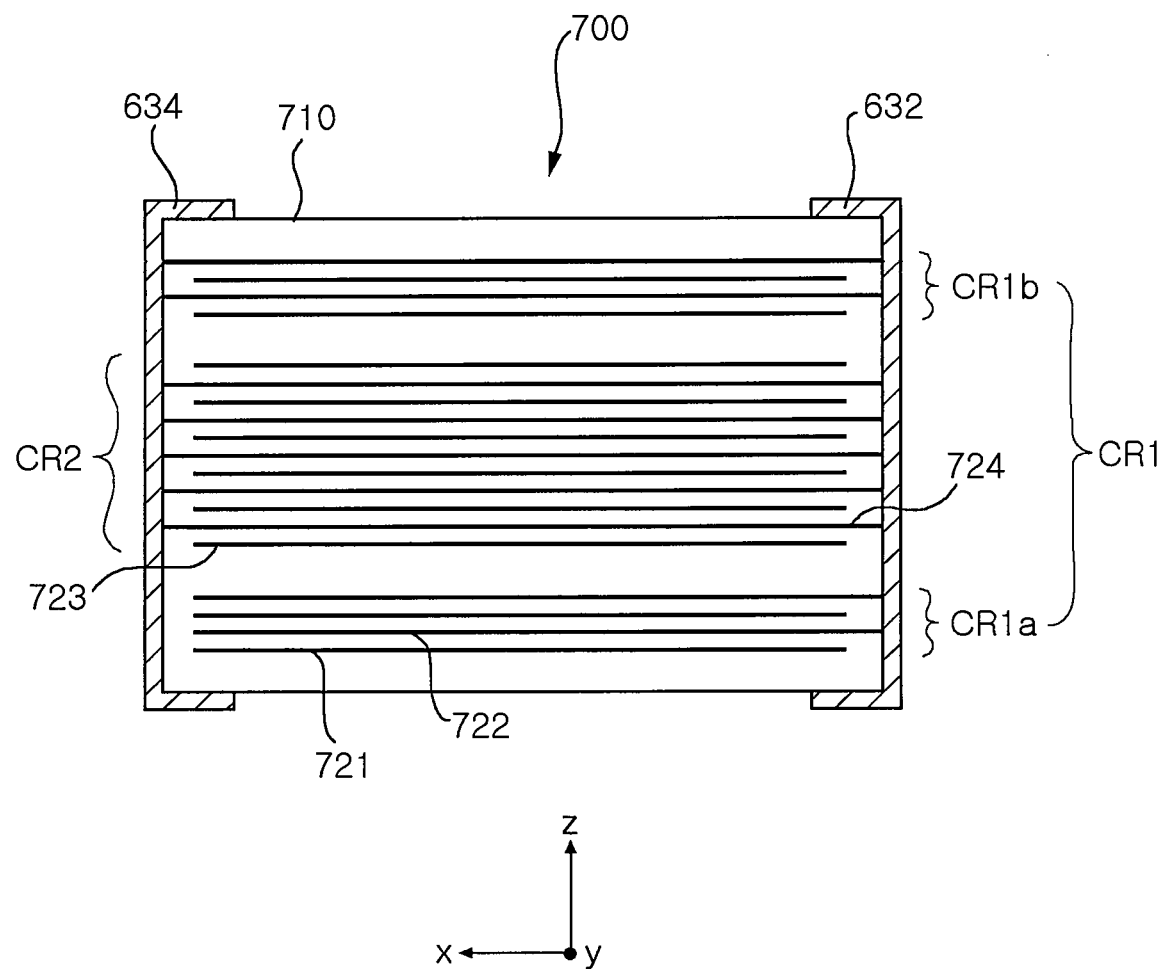
FIG. 27 is a cross-sectional view illustrating a multilayer chip capacitor according to a further exemplary embodiment of the invention.
Figure 28:
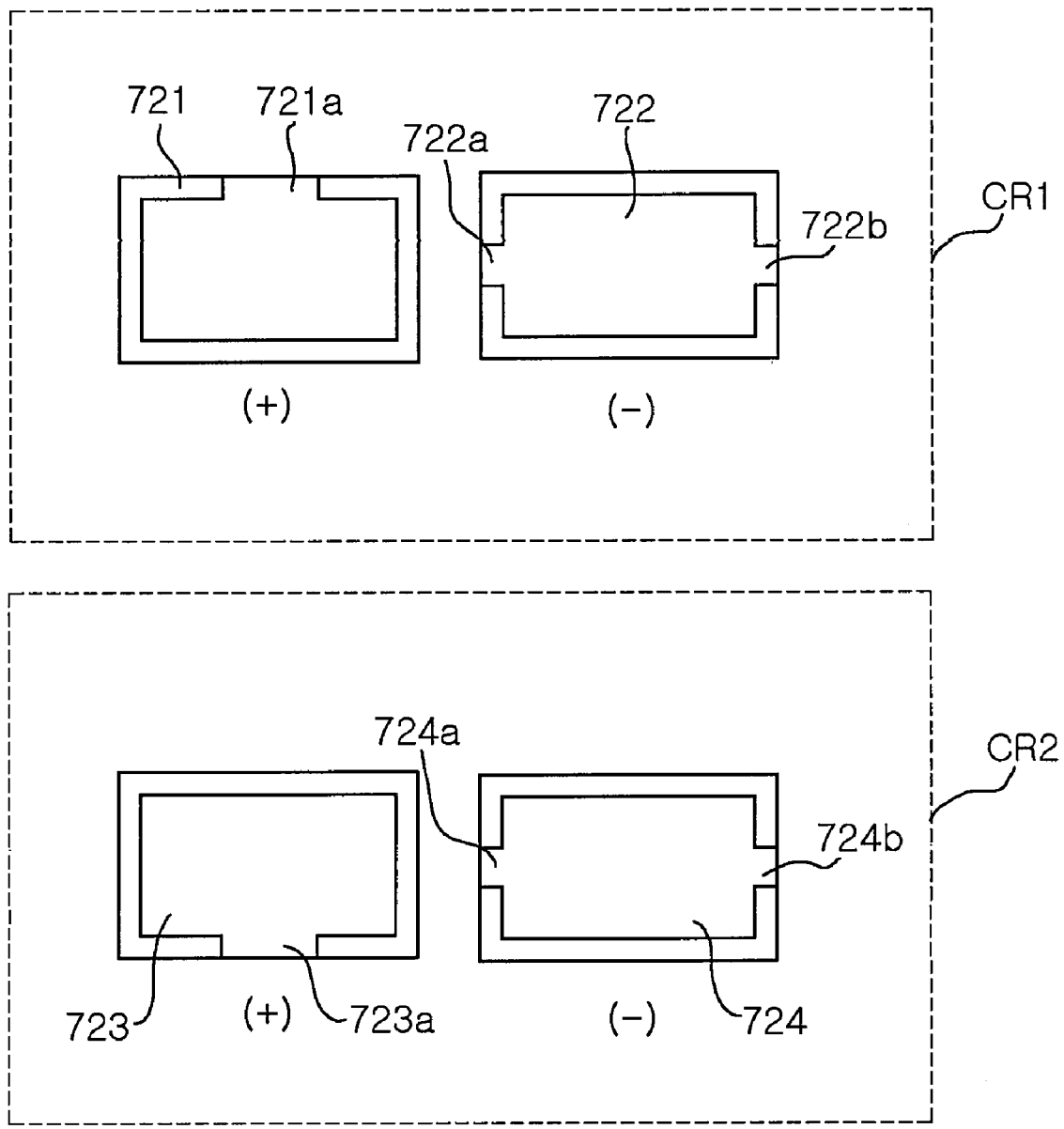
FIG. 28 is a plan view illustrating an inner electrode structure of the capacitor shown in FIG. 27.

FIG. 27 is a cross-sectional view illustrating a multilayer chip capacitor according to a further exemplary embodiment of the invention. FIG. 28 is a plan view illustrating an inner electrode structure of the capacitor shown in FIG. 27. The capacitor of FIGS. 27 and 28 may be configured as a four-terminal capacitor including first to fourth outer electrodes 631 to 634 in the same manner as FIG. 24. Also in the present embodiment, a first capacitor unit CR1 operates in a first frequency range and a second capacitor unit CR2 operates in a second frequency range lower than the first frequency range. The capacitor units CR1 and CR2 may have an SRF ranging from 5 MHz to 15 MHz, and from 100 kHz to 5 MHz, respectively.

Referring to FIGS. 27 and 28, in the first capacitor unit CR1, a first inner electrode 721 is connected to a first outer electrode 631 through a lead 721a. A second inner electrode 722 is connected to a second outer electrode 632 and a fourth outer electrode 634 through leads 722a and 722b, respectively. In the second capacitor unit CR2, a third inner electrode 723 is connected to a third outer electrode 633 through a lead 723a. A fourth inner electrode 724 is connected to a fourth outer electrode 734 and the second outer electrode 632 through leads 724a and 724b, respectively. The second inner electrode 722 and the fourth inner electrode 724 are commonly connected to the outer electrodes 622 and 624 of one polarity, for example, negative polarity. However, the first inner electrode 721 and the third inner electrode 723 of another polarity, for example, positive polarity are connected to the other outer electrodes 621 and 623 electrically insulated from each other. Thus, the first capacitor unit CR1 and the second capacitor unit CR2 can be electrically insulated from each other in the multilayer chip capacitor 700.

As set forth above, according to exemplary embodiments of the invention, a single capacitor is employed to reduce a PDN impedance to a target impedance or less in a wide frequency range from hundreds of kHz to hundreds of MHz. Thus significantly reduces the number of decoupling capacitors utilized in a digital switching circuit such as a high speed MPU and ensures the decoupling capacitors to be mounted in a less space at a low cost effectively. Moreover, this allows a power distribution network to be easily designed and the power distribution network to be implemented with a fewer number of multilayer chip capacitors, thereby saving costs and space required for implementing the power distribution network.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer chip capacitor comprising:
a capacitor body having a plurality of dielectric layers laminated therein, the capacitor body comprising first and second capacitor units arranged in a laminated direction, wherein:
first to fourth outer electrodes formed on side surfaces of the capacitor body, respectively, wherein the first and third outer electrodes have polarity identical to each other, and the second and fourth outer electrodes have polarity identical to each other but different from the polarity of the first outer electrode,
the first capacitor unit comprises first and second inner electrodes alternately arranged in the capacitor body to oppose each other while interposing a corresponding one of the dielectric layers, the first and second inner electrodes connected to the first and second outer electrodes, respectively to have polarity different from each other,
the second capacitor unit comprises third and fourth inner electrodes alternately arranged in the capacitor body to oppose each other while interposing another corresponding one of the dielectric layers, the third and fourth inner electrodes connected to the third and fourth outer electrodes, respectively to have polarity different from each other,
the first capacitor unit and the second capacitor unit are electrically insulated from each other in the multilayer chip capacitor,
the first capacitor unit operates in a first frequency range and the second capacitor unit operates in a second frequency range lower than the first frequency range,
the multilayer chip capacitor is a four-terminal capacitor comprising a respective one of the first to fourth outer electrodes, and
the first to fourth inner electrodes are connected to the first to fourth outer electrodes, respectively by one lead.

2. The multilayer chip capacitor of claim 1, wherein the first capacitor unit has a resonance frequency higher than a resonance frequency of the second capacitor unit.

3. The multilayer chip capacitor of claim 2, wherein the first capacitor unit has a resonance frequency ranging from 5 MHz to 15 MHz and the second capacitor unit has a resonance frequency ranging from 100 kHz to 5 MHz.

4. The multilayer chip capacitor of claim 1, wherein the first capacitor has an equivalent series inductance of 150 pH or less.

5. The multilayer chip capacitor of claim 1, wherein a total lamination number of the inner electrodes of the first capacitor unit is smaller than a total lamination number of the inner electrodes of the second capacitor unit.

6. The multilayer chip capacitor of claim 1, wherein the first capacitor unit is disposed in a lower part of the capacitor body and the second capacitor unit is disposed above the first capacitor unit.

7. The multilayer chip capacitor of claim 1, wherein the first capacitor unit comprises upper and lower portions, wherein the second capacitor unit is disposed between the upper and lower portions of the first capacitor unit and the upper and lower portions are disposed above and below the second capacitor unit.

8. The multilayer chip capacitor of claim 7, wherein the first capacitor units are disposed symmetrically in a laminated direction while interposing the second capacitor unit and the multilayer chip capacitor is horizontally symmetrical.

9. The multilayer chip capacitor of claim 1, wherein a pair of the first and second inner electrodes opposing each other in the first capacitor unit define one layer, and a pair of the third and fourth inner electrodes opposing each other in the second capacitor unit define another layer,
wherein an ESL per layer of the first and second inner electrodes is smaller than an ESL per layer of the third and fourth inner electrodes.

10. The multilayer chip capacitor of claim 1, wherein the first and second outer electrodes are disposed on opposing first and second longer side surfaces of the capacitor body and the third and fourth outer electrodes are disposed on opposing first and second shorter side surfaces.

11. The multilayer chip capacitor of claim 10, wherein a current flowing in the first and second inner electrodes of the first capacitor unit is perpendicular to a current flowing in the third and fourth inner electrodes of the second capacitor unit.

12. The multilayer chip capacitor of claim 10, wherein leads of the first and second inner electrodes of the first capacitor unit have widths greater than widths of leads of the third and fourth inner electrodes.

13. The multilayer chip capacitor of claim 1, wherein the first and third outer electrodes are disposed on opposing first and second longer side surfaces of the capacitor body and the second and fourth outer electrodes are disposed on opposing first and second shorter side surfaces of the capacitor body.

14. The multilayer chip capacitor of claim 13, wherein the multilayer chip capacitor is a four-terminal capacitor having a respective one of the first to fourth outer electrodes, and the first and fourth inner electrodes are connected to the first to fourth outer electrodes, respectively through one lead.

15. The multilayer chip capacitor of claim 13, wherein the multilayer chip capacitor is a four-terminal capacitor having a respective one of the first to fourth outer electrodes,
the first and third inner electrodes are connected to the first and third outer electrodes, respectively through one lead, and the second and fourth inner electrodes are connected to the second and fourth outer electrodes through two leads, respectively.

16. A multilayer chip capacitor comprising:
a capacitor body having a plurality of dielectric layers laminated therein, the
capacitor body comprising first and second capacitor units arranged in a laminated direction, wherein:
first to fourth outer electrodes formed on side surfaces of the capacitor body, respectively, wherein the first and third outer electrodes have polarity identical to each other, and the second and fourth outer electrodes have polarity identical to each other but
different from the polarity of the first outer electrode,
the first capacitor unit comprises first and second inner electrodes alternately arranged in the capacitor body to oppose each other while interposing a corresponding one of the dielectric layers, the first and second inner electrodes connected to the first and second outer electrodes, respectively to have polarity different from each other,
the second capacitor unit comprises third and fourth inner electrodes alternately arranged in the capacitor body to oppose each other while interposing another corresponding one of the dielectric layers, the third and fourth inner electrodes connected to the third and fourth outer electrodes, respectively to have polarity different from each other, the first capacitor unit and the second capacitor unit are electrically insulated from each other in the multilayer chip capacitor, the first capacitor unit operates in a first frequency range and the second capacitor unit operates in a second frequency range lower than the first frequency range, the first and second outer electrodes are disposed on opposing first and second longer side surfaces of the capacitor body and the third and fourth outer electrodes are disposed on opposing first and second shorter side surfaces, a plurality of the first and second outer electrodes are arranged alternately on each of the longer side surfaces of the capacitor body, and the first and second inner electrodes are connected to the plurality of first and second outer electrodes through leads, respectively, a single third outer electrode is disposed on a first shorter side surface and a single fourth outer electrode is disposed on a second shorter side surface, and the third and fourth inner electrodes are connected to the third and fourth outer electrodes, respectively through a single lead.

17. The multilayer chip capacitor of claim 16, wherein the multilayer chip capacitor is a ten-terminal capacitor comprising four first outer electrodes, four second outer electrodes, one third outer electrode and one fourth outer electrode.

18. The multilayer chip capacitor of claim 16, wherein the first and second inner electrodes adjacent to each other in a laminated direction have leads disposed adjacent to each other in a laminated direction.

19. The multilayer chip capacitor of claim 16, wherein each of the first and second inner electrodes comprises at least two leads,
wherein the leads of the first inner electrode are arranged in an interdigitated configuration, adjacent to the leads of the second inner electrode and connected to corresponding ones of the outer electrodes with identical polarity thereto, respectively.

20. The multilayer chip capacitor of claim 16, wherein:
each of the first and second inner electrodes has two leads led out to first and second longer side surfaces, respectively and connected to the first and second outer electrodes, respectively,
in the each of the first and second inner electrodes, a corresponding one of the leads led out to the first longer side surface is arranged shifted to a position corresponding to the outer electrode immediately adjacent thereto, with respect to another corresponding lead led out to the second longer side surface, and
in the first capacitor unit, the leads led out to each of the first and second longer side surfaces are arranged in a zigzag shape with respect to each other along
a laminated direction from the longer side surface.

21. The multilayer chip capacitor of claim 16, wherein:
each of the first and second inner electrodes has one lead connected to the first and second outer electrodes, and
the first and second inner electrodes having the leads led out to an identical one of the side surfaces of the capacitor body and adjacent to each other in a laminated direction have the leads connected to the first and second outer electrodes adjacent to each other on the identical side surface.

22. A motherboard apparatus comprising:
a motherboard;
a package board mounted on the motherboard;
a central processing unit chip mounted on the package board; and
at least one multilayer chip capacitor connected to a power circuit for supplying power to the central processing unit and used as a decoupling capacitor,
wherein the multilayer chip capacitor comprises:
a capacitor body having a plurality of dielectric layers laminated therein, the capacitor body comprising first and second capacitor units arranged in a laminated direction; and
first to fourth outer electrodes formed on side surfaces of the capacitor body, respectively, wherein the first and third outer electrodes have polarity identical to each other, and the second and fourth outer electrodes have polarity identical to each other but different from the polarity of the first outer electrode,
wherein the first capacitor unit comprises first and second inner electrodes alternately arranged in the capacitor body to oppose each other while interposing a corresponding one of the dielectric layers, the first and second inner electrodes connected to the first and second outer electrodes, respectively to have polarity different from each other,
the second capacitor unit comprises third and fourth inner electrodes alternately arranged in the capacitor body to oppose each other while interposing another corresponding one of the dielectric layers, the third and fourth inner electrodes connected to the third and fourth outer electrodes, respectively to have polarity different from each other,
the first capacitor unit and the second capacitor unit are electrically insulated from each other in the multilayer chip capacitor,
the first capacitor unit operates in a first frequency range and the second capacitor unit operates in a second frequency range lower than the first frequency range,
the multilayer chip capacitor is a four-terminal capacitor comprising a respective one of the first to fourth outer electrodes, and
the first to fourth inner electrodes are connected to the first to fourth outer electrodes, respectively by one lead.

23. The motherboard apparatus of claim 22, wherein the first capacitor unit has a resonance frequency higher than a resonance frequency of the second capacitor unit.

24. The motherboard of claim 23, wherein the first capacitor unit has a resonance frequency ranging from 5 MHz to 15 MHz and the second capacitor unit has a resonance frequency ranging from 100 kHz to 5 MHz.

25. The motherboard of claim 22, wherein the multilayer chip capacitor is disposed on the package board.

26. The motherboard of claim 25, wherein the multilayer chip is disposed on a bottom surface of the package board.

27. The motherboard of claim 25, wherein the multilayer chip capacitor is disposed on a top surface of the package board.

28. The motherboard apparatus of claim 22, wherein the multilayer chip capacitor is directly mounted on the motherboard in the vicinity of the package board.

29. The motherboard apparatus of claim 22, wherein the multilayer chip capacitor is mounted on a bottom surface of the motherboard.

30. The motherboard apparatus of claim 22, wherein the motherboard apparatus employs the multilayer chip capacitor as a decoupling capacitor of the power circuit in place of an mid-frequency decoupling two-terminal chip capacitor and a high-frequency decoupling chip capacitor.

31. A power distribution network comprising: a voltage regulator module, a digital switching circuit consuming power, and a power transfer circuit supplying power from the voltage regulator module to the digital switching circuit and including at least one multilayer chip capacitor,
wherein the multilayer chip capacitor comprises:
a capacitor body having a plurality of dielectric layers laminated therein, the capacitor body comprising first and second capacitor units arranged in a laminated direction; and
first to fourth outer electrodes formed on side surfaces of the capacitor body, respectively, wherein the first and third outer electrodes have polarity identical to each other, and the second and fourth outer electrodes have polarity identical to each other but different from the polarity of the first outer electrode,
wherein the first capacitor unit comprises first and second inner electrodes alternately arranged in the capacitor body to oppose each other while interposing a corresponding one of the dielectric layers, the first and second inner electrodes connected to the first and second outer electrodes, respectively to have polarity different from each other,
the second capacitor unit comprises third and fourth inner electrodes alternately arranged in the capacitor body to oppose each other while interposing another corresponding one of the dielectric layers, the third and fourth inner electrodes connected to the third and fourth outer electrodes, respectively to have polarity different from each other,
the first capacitor unit and the second capacitor unit are electrically insulated from each other in the multilayer chip capacitor,
the first capacitor unit operates in a first frequency range and the second capacitor unit operates in a second frequency range lower than the first frequency range,
the multilayer chip capacitor is a four-terminal capacitor comprising a respective one of the first to fourth outer electrodes, and
the first to fourth inner electrodes are connected to the first to fourth outer electrodes, respectively by one lead.

32. The power distribution network of claim 31, wherein the digital switching circuit is a central processing unit.

33. The power distribution network of claim 31, wherein the first capacitor unit has a resonance frequency ranging from 5 MHz to 15 MHz and the second capacitor unit has a resonance frequency ranging from 100 kHz to 5 MHz.

* * * * *